(12) United States Patent
Kawauchi

(10) Patent No.: US 6,440,633 B1
(45) Date of Patent: Aug. 27, 2002

(54) PLANOGRAPHIC PRINTING ORIGINAL PLATE

(75) Inventor: Ikuo Kawauchi, Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 09/412,751

(22) Filed: Oct. 5, 1999

(30) Foreign Application Priority Data

Oct. 6, 1998 (JP) ............................................. 10-284617

(51) Int. Cl.$^7$ ................................................. G03F 7/11
(52) U.S. Cl. ................................ 430/270.1; 430/278.1; 430/964
(58) Field of Search ............................. 430/302, 270.1, 430/171, 275.1, 278.1, 944, 945, 964

(56) References Cited

U.S. PATENT DOCUMENTS

| | | | | |
|---|---|---|---|---|
| 4,049,746 A | * | 9/1977 | Muzyczko et al. | 260/851 |
| 4,483,913 A | | 11/1984 | Eklund et al. | 430/160 |
| 4,552,827 A | * | 11/1985 | Eklund et al. | 430/160 |
| 4,956,261 A | * | 9/1990 | Pawlowski et al. | 430/156 |
| 5,254,430 A | * | 10/1993 | Nagashima et al. | 430/166 |
| 5,476,754 A | * | 12/1995 | Imai et al. | 430/302 |
| 5,491,046 A | * | 2/1996 | DeBoer et al. | 430/302 |
| 5,840,467 A | * | 11/1998 | Kitatani et al. | 430/302 |
| 6,060,222 A | * | 5/2000 | West et al. | 430/326 |
| 6,083,662 A | * | 7/2000 | Miller et al. | 430/302 |
| 6,090,532 A | * | 7/2000 | West et al. | 430/326 |
| 6,114,089 A | * | 9/2000 | Takita et al. | 430/278.1 |
| 6,117,610 A | * | 9/2000 | Sheriff et al. | 430/190 |
| 6,277,541 B1 | * | 8/2001 | Uno et al. | 430/278.1 |
| 6,280,899 B1 | * | 8/2001 | Parsons et al. | 430/270.1 |

FOREIGN PATENT DOCUMENTS

| | | |
|---|---|---|
| EP | 0871070 A2 | 10/1998 |
| JP | 7-285275 | 10/1995 |
| JP | 10-69092 | 3/1998 |
| JP | 4-11-038629 | * 2/1999 |

OTHER PUBLICATIONS

Hackh's Chemical Dictionary, $3^{rd}$ Ed., pp. 432, 819 (1944).*

* cited by examiner

Primary Examiner—Janet Baxter
Assistant Examiner—Barbara Gilmore
(74) Attorney, Agent, or Firm—Burns, Doane, Swecker & Mathis, LLP

(57) ABSTRACT

A planographic printing original plate which comprises an intermediate layer which contains a polymer including, as a monomer unit, at least a monomer having an acid group and a monomer having an onium group; and a photosensitive layer comprised of a positive-type photosensitive composition for an infrared laser which contains: (A) at least an alkali-soluble polymeric compound; (B) a compound which has a function to deteriorate the solubility of the alkali-soluble polymeric compound in an alkaline aqueous solution due to compatibility with the alkali-soluble polymeric compound, the function being deteriorated by compound (B) being heated; and (C) a compound which generates heat by absorbing light, the intermediate layer and the photosensitive layer being formed sequentially on a support which has been subjected to a hydrophilizing treatment.

8 Claims, No Drawings

PLANOGRAPHIC PRINTING ORIGINAL PLATE

BACKGROUND OF THE INVENTION

1. Field of the Invention

The present invention relates to a planographic printing original plate which can be used as an offset printing master, and particularly to a planographic printing original plate (which can be formed by a so-called direct plate-making process) which can be directly inscribed based on digital signals of a computer or the like by using an infrared laser.

2. Description of the Related Art

In recent years, attention has been focused on a system in which a printing plate is directly formed based on digital signals in a computer or the like without using a lithographic film. In this system, lasers are useful as an exposure light source. High power and small-size lasers such as solid-state lasers and semiconductor lasers, which emit rays in regions from a near-infrared region to an infrared region, which lasers have recently been remarkably developed, are particularly useful.

As an image recording material suitable for writing using such lasers, for example, a positive-type image recording material disclosed in Japanese Patent Application Laid-Open (JP-A) No. 7-285,275 is used. The positive-type image recording material disclosed therein comprises a binder such as a cresol resin, a substance which absorbs light to generate heat, and a substance which is thermally decomposed like a quinone diazide and which, in a non-decomposed state, substantially reduces the solubility of the binder. When the positive-type image recording material is exposed to an infrared laser, in an exposed region of the positive image recording material, the substance which is provided to generate heat by absorbing light generates heat and the solubility is thereby revealed. Subsequently, when the positive-type image recording material is developed with an aqueous alkaline solution, only the above-described exposed region is dissolved and removed and a base surface is uncovered. In the above-described exposed region (non-image portions), a hydrophilic surface of the base is exposed. Accordingly, the exposed region retains water and forms an ink repellent portion. On the other hand, in a non-exposed region other than the aforementioned exposed region (image portions), a lipophilic photosensitive layer remains, and therefore, the non-exposed region becomes an ink receiving portion. As a result, desired image recording can be achieved.

However, not only such an image recording material but also positive-type photosensitive printing original plates conventionally widely used have the following problems. Namely, conventionally, an aluminum base material subjected to surface roughening, alkali etching treatment, or anodic oxidation treatment is used as a support. However, the surface of the aluminum support does not necessarily have sufficient hydrophilicity, and therefore, in the non-image region, an ink repulsive force is not sufficiently obtained, and the non-image region is thereby stained with ink (that is, smudging occurs). As a result, an image of high image quality is not obtained.

Further, heat generated in the exposed region (non-image portions) is absorbed into the aluminum support and thermal efficiency is low. Accordingly, in a development process, the solubility of the exposed region into an alkaline developing solution is not sufficiently obtained, and an oleophilic photosensitive layer is not dissolved and a portion thereof remains in the exposed region after the development processing, thereby causing the smudging. As a result, an image of high image quality is not obtained.

In order to solve the above-mentioned problem in which the smudging is caused, there has conventionally been known a technique in which the hydrophilic property on a surface of the aforementioned aluminum support is improved so as to allow the exposed region (non-image portions) to be made hydrophilic. However, when an oleophilic positive-type photosensitive layer is provided directly on the hydrophilic support, layer-to-layer adhesion between the support and the photosensitive layer is poor, and therefore, a problem arises in which the durability in printing (that is, an ability of normal printing) becomes deteriorated.

For this reason, only the exposed region (non-image portions) is made hydrophilic by using a developing solution containing silicate such as potassium silicate and sodium silicate during the development processing. However, when the developing solution containing silicate is used, solid matters originating from $SiO_2$ is apt to be precipitated. Further, when a waste liquid of the developer is neutralized, gel originating from $SiO_2$ may be generated.

Accordingly, there has been made a demand for a technique in which even if an oleophilic positive-type photosensitive layer is provided directly on a support of which surface is in advance made hydrophilic, the layer-to-layer adhesion between the support and the photosensitive layer and the durability in printing are both excellent, which results in no smudging being caused.

Under these circumstances, in U.S. Pat. No. 3,136,636, it is proposed that an intermediate layer comprising a water soluble polymer such as polyacrylic acid and carboxylmethylhydroxy ethyl cellulose is provided. In this case, a problem exists in which the durability in printing is not sufficiently obtained. Further, in U.S. Pat. No. 4,483,913, it is proposed that an intermediate layer comprising a quaternary ammonium compound such as poly(dimethyldiaryl ammonium chloride), but in this case, a problem exists in which the aforementioned smudging is caused.

In order to solve various problems in these conventional arts, the present inventors have realized a planographic printing plate which is excellent in the durability in printing and prevents the smudging by providing an intermediate layer which contains a polymeric compound having a specified structural unit such as p-vinyl benzoate (Japanese Patent Application Laid-Open (JP-A) No. 10-69,092).

The aforementioned intermediate layer itself has an excellent effect in improvement of the durability in printing, but there is room for further improvement with respect to the viewpoint of preventing occurrence of the smudging. Namely, for example, when the intermediate layer is combined with a support layer having excellent hydrophilicity, it has effects in that excellent durability in printing is obtained and the above-mentioned smudging does not occur. Therefore, there has been desired further improvement with respect to the effect that no smudging is caused, which is a function of the intermediate layer itself.

The present invention is provided to solve the aforementioned various problems in the conventional arts and to achieve the following object. Namely, an object of the present invention is to provide a planographic printing original plate which, with a processor or a printer being capable of being utilized as is, can be directly inscribed based on digital signals of a computer or the like and which has excellent durability in printing and causes no smudging.

SUMMARY OF THE INVENTION

The above-described object is achieved by a planographic printing original plate of the present invention. Namely, the planographic printing original plate of the present invention comprises an intermediate layer which contains a polymer including, as a monomer unit, at least a monomer having an acid group and a monomer having an onium group; and a photosensitive layer comprised of a positive-type photosensitive composition for an infrared laser which contains: (A) at least an alkali-soluble polymeric compound; (B) a compound which has a function to deteriorate the solubility of the alkali-soluble polymeric compound in an alkaline aqueous solution due to compatibility with the alkali-soluble polymeric compound, the function deteriorating by compound (B) being heated; and (C) a compound which generates heat by absorbing light, the intermediate layer and the photosensitive layer being formed sequentially on a support which has been subjected to a hydrophilizing treatment.

In the planographic printing original plate of the present invention, an aspect in which the polymer contained in the intermediate layer is a polymeric compound, an aspect in which the polymer is soluble in alkali water, an aspect in which the number average molecular weight (Mn) of the polymer is in the range of 300 to 5,000, and an aspect in which the polymer is obtained by using together a polymerization initiator and a chain transfer agent during radical polymerization are preferably provided. Further, an aspect in which the hydrophilizing treatment is a silicate treatment is also preferably provided.

In the planographic printing original plate of the present invention, since the intermediate layer which contains a polymer including, as a monomer unit, a monomer having an acid group and a monomer having an onium group is provided between a support and a photosensitive layer, as compared with a conventional planographic printing original plate in which an oleophilic photosensitive layer is directly formed on a support subjected to the hydrophilizing treatment, layer-to-layer adhesion between the support and the photosensitive layer is improved and the durability in printing remarkably improves.

Further, in the non-image portions, the acid group of the polymer contained in the intermediate layer is apt to be dissociated in an alkaline developing solution, and therefore, the polymer is dissolved and removed from the surface of the support. Moreover, the polymer has also the onium group and the solubility thereof is greater than that of a polymer having only an acid group, which polymer is contained in an intermediate layer of a planographic printing original plate described in JP-A No. 10-69,092. Accordingly, in the planographic printing original plate of the present invention, the surface of the support, which has been subjected to the hydrophilizing treatment in a development process, is apt to be uncovered and an effect of preventing occurrence of the smudging is remarkably improved.

DESCRIPTION OF THE PREFERRED EMBODIMENTS

A planographic printing original plate of the present invention will be described hereinafter in detail. The planographic printing original plate of the present invention comprises, on a support thereof, at least an intermediate layer containing a polymer including, as a monomer unit, monomer having an acid group and a monomer having an onium group, and a photosensitive layer containing a positive-type photosensitive composition for an infrared laser (hereinafter referred to merely as "photosensitive composition"), and further includes other layers as occasion demands.

[Intermediate Layer]

The composition contained in the intermediate layer will be described hereinafter.

The above-mentioned composition is obtained by polymerization of at least a monomer having an acid group and a monomer having an onium group to thereby form a compound having these monomers as a monomer unit.

The above-described acid group preferably has an acid dissociation index (pKa) of 7 or less, and —COOH, —SO$_3$H, —OSO$_3$H, —PO$_3$H$_2$, —OPO$_3$H$_2$, —CONHSO$_2$, —SO$_2$NHSO$_2$—, and the like are more preferable. Among them, —COOH is particularly preferable.

The above-described onium group preferably comprises atoms of the fifth or sixth group of the periodic system, and an onium group containing nitrogen atoms, phosphorus atoms, or sulfur atoms is more preferable. Among them, the onium group containing nitrogen atoms is particularly preferable.

Among the aforementioned polymers, a main chain structure thereof is preferably those of an acrylic resin, a methacrylic resin, a vinyl-based polymer such as polystyrene, an urethane resin, polyester, and polyamide, and the main chain structure is more preferably that of the vinyl polymer. Further, it is particularly preferable that the monomer having an acid group is a compound represented by one of the following general formulae (1) and (2) and the monomer having an onium group is a compound represented by any one of the following general formulae (3), (4), and (5).

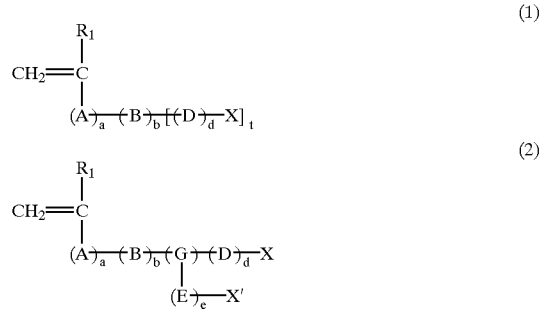

In the above-described general formulae (1) and (2), A represents a divalent linking group. B represents a substituted or unsubstituted aromatic group. D and E each represent a divalent linking group. G represents a trivalent linking group. X and X' each represent an acid group having a pKa of 7 or less, or alkaline metallic salt or ammonium salt thereof. R$_1$ represents a hydrogen atom, an alkyl group, or a halogen atom. a, b, d, and e each represent 0 or 1. t represents an integer of 1 to 3.

Among the monomers having an acid group, which are represented by the above-described general formulae (1) and (2), the following compound is more preferable. That is, in the compound, A is —COO— or —CONH—, B is a substituted or unsubstituted phenylene group whose substituent is one of a hydroxyl group, a halogen atom, and an alkyl group, D and E each represent an alkylene group, or a divalent linking group represented by C$_n$H$_{2n}$O, C$_n$H$_{2n}$S, or C$_n$H$_{2n+1}$N, G represents a trivalent linking group represented by C$_n$H$_{2n-1}$, C$_n$H$_{2n-1}$O, C$_n$H$_{2n-1}$S, or C$_n$H$_{2n}$N, n is an integer of 1 to 12, X and X' each represent carboxylic acid, sulfonic acid, phosphonic acid, sulfuric monoester, or phosphoric acid monoester, R$_1$ represents a hydrogen atom or an alkyl group, and a, b, d, and e each represent 0 or 1 (in this case, a and b does not concurrently represent 0).

In the present invention, among the above-described monomers having an acid group, the compound represented by the general formula (1) is more preferable. It is particularly preferable to use a compound in which B is a substituted or unsubstituted phenylene group whose substituent is one of a hydroxyl group or an alkyl group having 1 to 3 carbon atoms, D and E each represent an alkylene group having 1 to 2 carbon atoms, or an alkylene group having 1 to 2 carbon atoms linked by oxygen atoms, $R_1$ is a hydrogen atom or an alkyl group, X is a carbonic acid group, a is 0, and b is 1.

Concrete examples of the monomers having an acid group are shown below. However, the present invention is not limited to the same. Namely, acrylic acid, methacrylic acid, crotonic acid, isocrotonic acid, itaconic acid, maleic acid, maleic anhydride, and the like can be used. Further, the following compounds are also used.

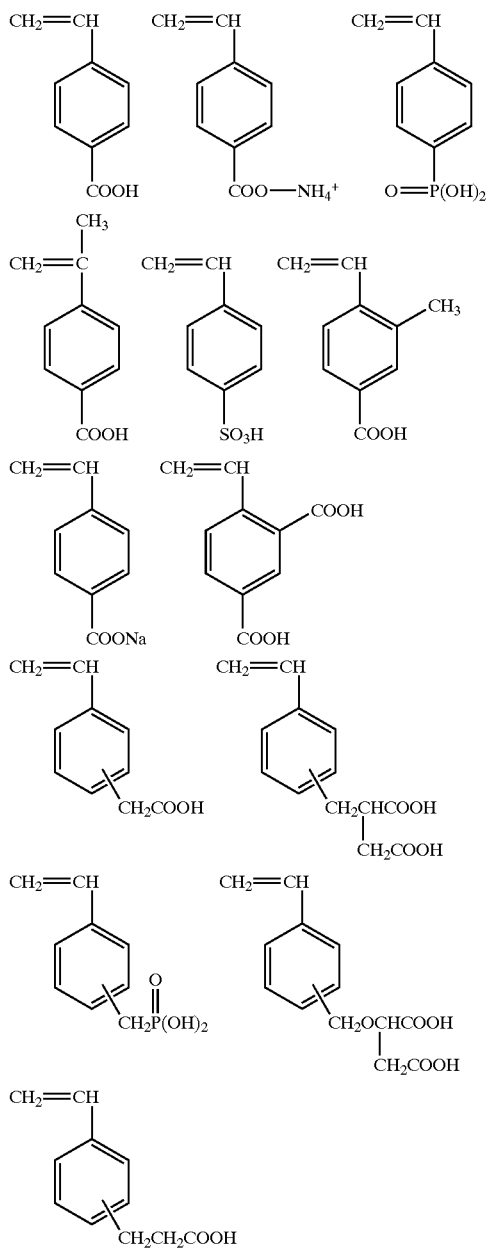

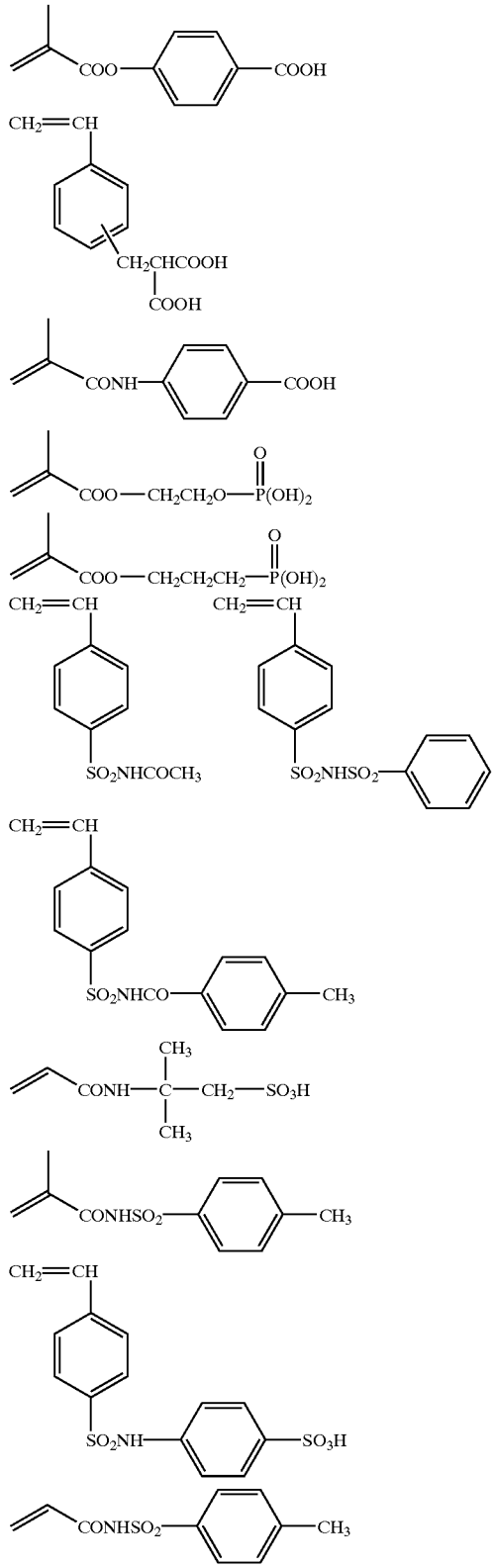

The above-described monomer having an onium group is preferably a compound represented by any one of the following general formulae (3), (4), and (5).

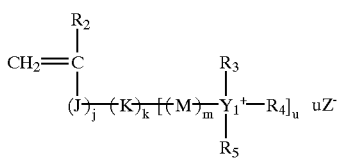
(3)

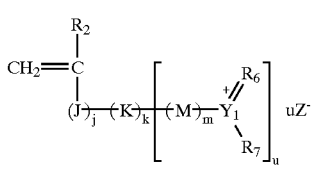
(4)

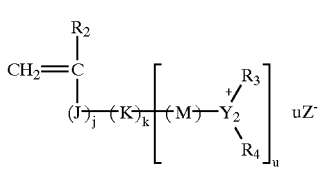
(5)

In the above-described general formulae (3), (4), and (5), J represents a divalent linking group. K represents a substituted or unsubstituted aromatic group. M represents a divalent linking group. $Y_1$ represents an atom in the fifth group of the periodic system. $Y_2$ represents an atom in the sixth group of the periodic system. $Z^-$ represents a counter anion. $R_2$ represents a hydrogen atom, an alkyl group, or a halogen atom. $R_3$, $R_4$, $R_5$, and $R_7$ each represents a hydrogen atom, or any one of an alkyl group, an aromatic group, and an aralkyl group, to which a substituent group may be bonded. $R_6$ represents substituted or unsubstituted alkylidene. $R_3$ and $R_4$, and $R_6$ and $R_7$ are each bonded together to form a ring. j, k, and m each represent 0 or 1. u represents an integer of 1 to 3.

A more preferable example of the above-described monomers having an onium group is a compound in which J is —COO— or —CONH—, K represents a substituted or unsubstituted phenylene group in which a substituent group in the substituted phenylene group is a hydroxy group, a halogen group, or an alkyl group, M is a divalent linking group represented by an alkylene group, $C_nH_{2n}O$, $C_nH_{2n}S$, or $C_nH_{2n+1}N$; n is an integer of 1 to 12; $Y_1$ represents a nitrogen atom or a phosphorus atom; $Y_2$ represents a sulfur atom; $Z^-$ represents a halogen ion, $PF_6^-$, $BF_4^-$, or $R_8SO_3^-$, $R_2$ represents a hydrogen atom or an alkyl group, $R_3$, $R_4$, $R_5$, and $R_7$ each represent any one of an alkyl group, an aromatic group, and an aralkyl group, which each have 1 to 10 carbon atoms and to which a hydrogen atom or a substituent group may be bonded, $R_6$ represents an alkylidene group or substituted alkylidene having 1 to 10 carbon atoms (wherein, $R_3$ and $R_4$, or $R_6$ and $R_7$ may be bonded together to form a ring), j, k, and m each represent 0 or 1 (wherein, j and k does not concurrently represent 0), and $R_3$ represents any one of an alkyl group, an aromatic group, and an aralkyl group having 1 to 10 carbon atoms, to which a substituent group may be bonded.

A particularly preferable example of the above-described monomers having an onium group is a compound in which K is a substituted or unsubstituted phenylene group in which a substituent group of the substituted phenylene group is a hydrogen atom or an alkyl group having 1 to 3 carbon atoms, M represents an alkylene group having 1 to 2 carbon atoms, or an alkylene group having 1 to 2 carbon atoms bonded together by oxygen atoms, $Z^-$ represents chlorine ion or $R_8SO_3^-$, $R_2$ represents a hydrogen atom or a methyl group, j is 0, k is 1, and $R_3$ represents an alkyl group having 1 to 3 carbon atoms.

Concrete examples of the above-described monomer having an onium group are described below. However, the present invention is not limited to these examples.

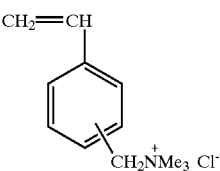

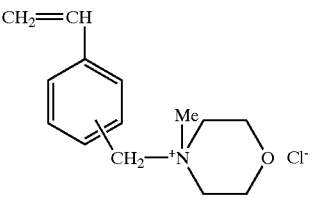

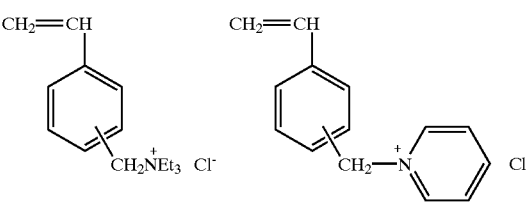

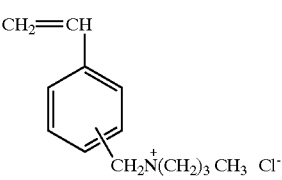

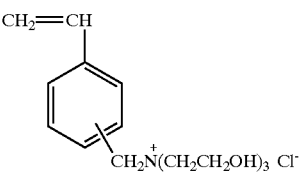

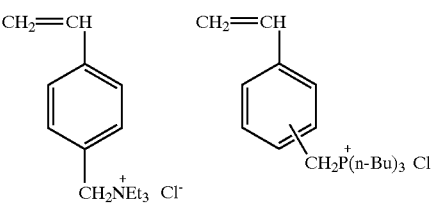

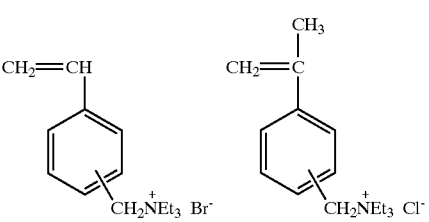

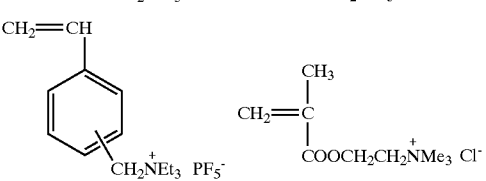

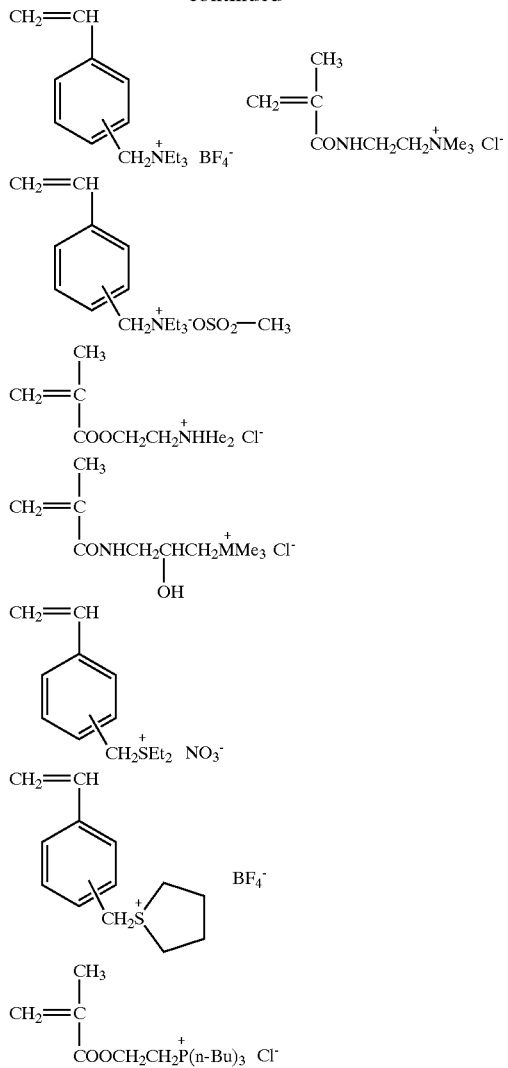

The above-described polymers each may contain the monomers having an acid group singly or in combination of two or more, or each may contain the monomers having an onium group singly or in combination of two or more.

When the above-described polymers contain the monomers having an acid group, the content of the monomers having an acid group is usually 1 mol % or more, preferably 5 mol % or more. When the polymers contain the monomers having an onium group, the content of the monomers having an onium group is usually 1 mol % or more, preferably 5 mol % or more. When the content of the monomers having an acid group is 20 mol % or more, dissolution and removal of the compound during alkaline development are further promoted. When the content of the monomers having an onium group is 1 mol % or more, the layer-to-layer adhesion between the support and the photosensitive layer is further improved due to a synergistic effect with the acid group.

The above-described polymer may also contain, as a copolymerization component, at least one selected from polymeric monomers described in the following monomers (1) to (14).

(1) acrylamides, methacrylamides, acrylates, methacrylates, and hydroxystyrenes, which have each an aromatic hydroxyl group, such as N-(4-hydroxyphenyl) acrylamides or N-(4-hydroxyphenyl) methacrylamides, o-, m-, or p-hydroxystyrene, o- or m-bromo-p-hydroxystyrene, o- or m-chloro-p-hydroxystyrene, or o-, m-, or p-hydroxyphenyl acrylate or methacrylate (2) unsaturated carboxylic acids such as acrylic acid, methacrylic acid, maleic acid, maleic anhydride, half ester thereof, itaconic acid, itaconic anhydride, and half ester thereof (3) acrylamides such as N-(o-aminosulfonylphenyl) acrylamide, N-(m-aminosulfonylphenyl)acrylamide, N-(p-aminosulfonylphenyl)acrylamide, N-[1-(3-aminosulfonyl)naphthyl]acrylamide, and N-(2-aminosulfonylethyl)acrylamide, methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, and N-(2-aminosulfonylethyl)methacrylamide, unsaturated sulphonamide such as acrylates, for example, o-aminosulphonylphenyl acrylate, m-aminosulphonylphenyl acrylate, p-aminosulphonylphenyl acrylate, and 1-(3-aminosulphonylphenylnaphthyl)acrylate, and unsaturated sulphonamides such as methacrylates, for example, o-aminosulphonylphenyl methacrylate, m-aminosulphonylphenyl methacrylate, p-aminosulphonylphenyl methacrylate, and 1-(3-aminosulphonylphenylnaphthyl)methacrylate (4) phenylsulphonyl acrylamide which possibly has a substituent group such as tosyl acrylamide, and phenylsulphonyl methacrylamide which possibly has a substituent group such as tosyl methacrylamide (5) acrylates and methacrylates which have each an aliphatic hydroxyl group, for example, 2-hydroxyethyl acrylate, 2-hydroxyethyl methacrylate, and the like (6) (substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate (7) (substituted) methacrylates such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate (8) acrylamides or methacrylamides such as acrylamide, methacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, and N-ethyl-N-phenylmethacrylamide (9) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether

(10) vinyl esters such as vinyl acetate, vinyl chloroacetate, vinyl butyrate, and vinyl benzoate

(11) styrenes such as styrene, α-methylstyrene, methylstyrene, and chloromethylstyrene

(12) vinyl ketones such as methyl vinyl ketone, ethyl vinyl ketone, propyl vinyl ketone, and phenyl vinyl ketone

(13) olefins such as ethylene, propylene, isobutylene, butadiene, and isoprene
(14) N-vinylpyrolidone, N-vinylcarbazole, 4-vinylpyridine, acrylonitrile, and methacrylonitrile By properly altering the kind, composition ratio, and molecular weight of monomers in the above-described polymers, various polymers can be obtained.

Typical examples of the polymers are hereinafter described. The composition ratio of a polymer structure indicates mole percentage.

Examples of typical polymeric compounds

| | Structure | Number average molecular weight (Mn) |
|---|---|---|
| No. 1 | —(CH$_2$CH)$_{85}$— —(CH$_2$CH)$_{15}$— with phenyl-COOH and phenyl-CH$_2$N$^+$Et$_3$ Cl$^-$ | 2,100 |
| No. 2 | —(CH$_2$CH)$_{85}$— —(CH$_2$CH)$_{10}$— —(CH$_2$CH)$_5$— with phenyl-COOH, phenyl(meta)-CH$_2$N$^+$Et$_3$ Cl$^-$, and phenyl-CH$_2$N$^+$Et$_3$ Cl$^-$ | 4,800 |
| No. 3 | —(CH$_2$CH)$_{90}$— —(CH$_2$CH)$_{10}$— with phenyl-COOH and phenyl-CH$_2$N$^+$Me$_3$ Cl$^-$ | 3,200 |
| No. 4 | —(CH$_2$CH)$_{40}$— —(CH$_2$CH)$_{60}$— with phenyl-COOH and phenyl-CH$_2$P$^+$(n-Bu)$_3$ Cl$^-$ | 2,300 |
| No. 5 | —(CH$_2$CH)$_{50}$— —(CH$_2$CH)$_{50}$— with phenyl-SO$_3$H and phenyl-CH$_2$S$^+$(tetramethylene) · BF$_4^-$ | 1,400 |
| No. 6 | —(CH$_2$CH)$_{20}$— —(CH$_2$CH)$_{80}$— with phenyl-SO$_3$Na and phenyl-CH$_2$N$^+$(n-Bu)$_3$ PF$_6^-$ | 4,500 |

-continued
| No. 7 | 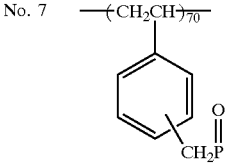 | 5,000 |
| No. 8 | 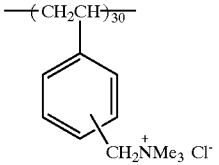 | 1,000 |
| No. 9 | 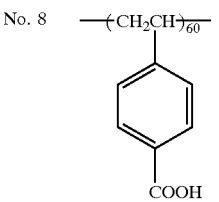 | 1,300 |
| No. 10 | 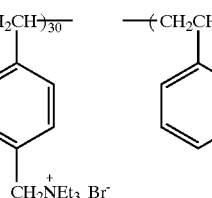 | 2,900 |
| No. 11 | 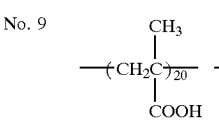 | 800 |
| No. 12 | 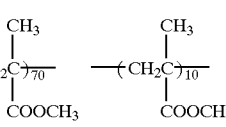 | 300 |
| No. 13 |  | 1,900 |
| No. 14 | 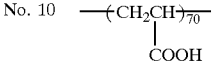 | 4,100 |

-continued
| | Structure | Molecular weight (Mw) |
|---|---|---|
| No. 15 | 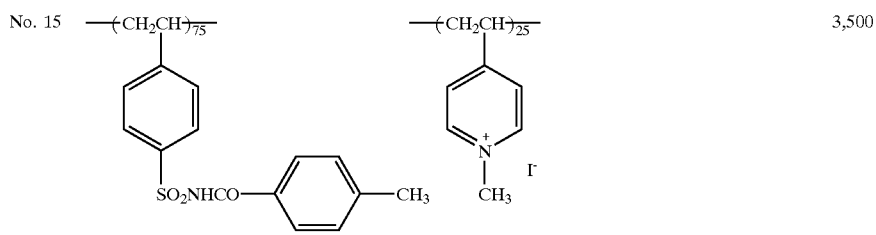 | 3,500 |
| No. 16 | 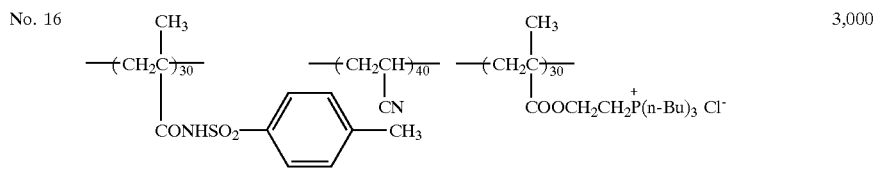 | 3,000 |
| No. 17 | 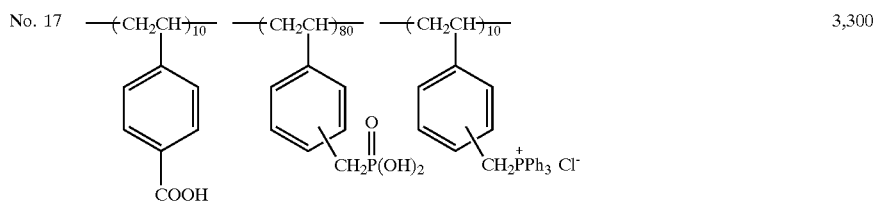 | 3,300 |
| No. 18 | 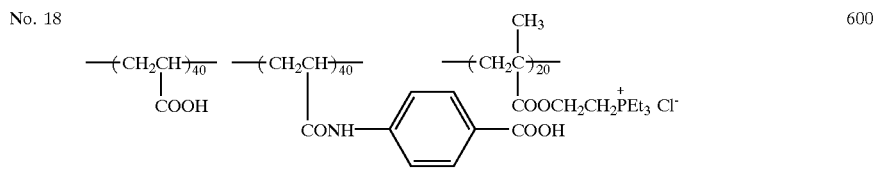 | 600 |
| No. 19 | 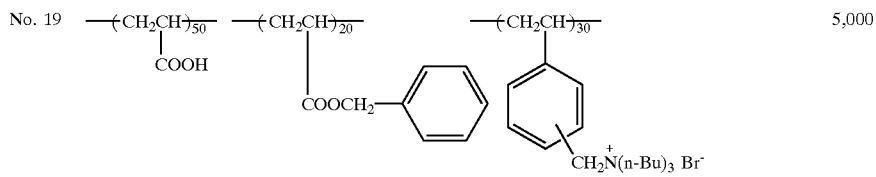 | 5,000 |
| No. 20 | 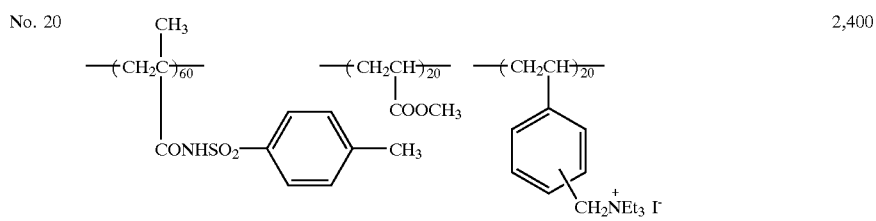 | 2,400 |
| No. 21 | 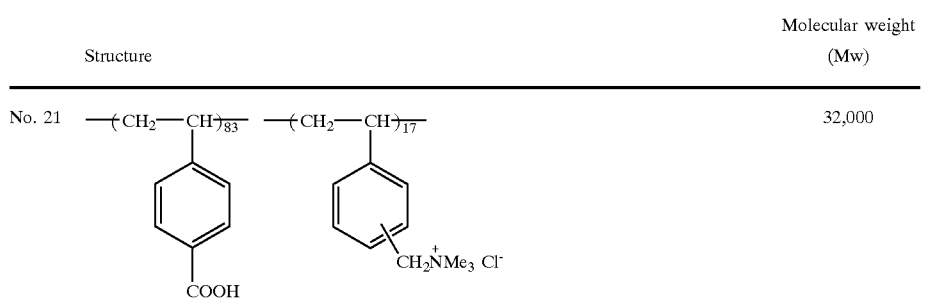 | 32,000 |

-continued

| No. 22 | $-(CH_2-CH)_{85}-$ (phenyl-COOH) $-(CH_2-CH)_{15}-$ (phenyl-$CH_2NEt_3^+$ $Cl^-$) | 28,000 |
| --- | --- | --- |
| No. 23 | $-(CH_2-CH)_{73}-$ (phenyl-COOH) $-(CH_2-CH)_{27}-$ (phenyl-$CH_2$-N$^+$(Me)(morpholino) $Cl^-$) | 26,000 |
| No. 24 | $-(CH_2-CH)_{64}-$ (phenyl-COOH) $-(CH_2-CH)_{36}-$ (phenyl-$CH_2$-pyridinium $Cl^-$) | 41,000 |
| No. 25 | $-(CH_2-CH)_{76}-$ (phenyl-COOH) $-(CH_2-CH)_{24}-$ (phenyl-$CH_2N(CH_2CH_2OH)_3^+$ $Cl^-$) | 11,000 |
| No. 26 | $-(CH_2-CH)_{88}-$ (phenyl-COOH) $-(CH_2-CH)_{12}-$ (phenyl-$CH_2P(n\text{-}Bu)_3^+$ $Cl^-$) | 17,000 |
| No. 27 | $-(CH_2-CH)_{58}-$ (phenyl-$SO_3H$) $-(CH_2-CH)_{42}-$ (phenyl-$CH_2P(n\text{-}Bu)_3^+$ $Cl^-$) | 36,000 |
| No. 28 | $-(CH_2-CH)_{73}-$ (phenyl-$SO_3H$) $-(CH_2-CH)_{27}-$ (phenyl-$CH_2NEt_3^+$ $Cl^-$) | 22,000 |

-continued
| No. 29 | 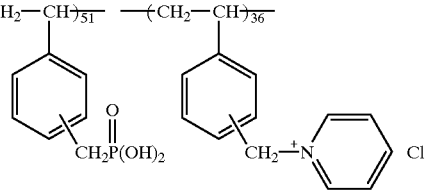 | 44,000 |
| No. 30 | 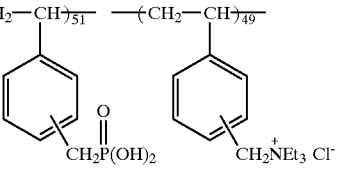 | 19,000 |
| No. 31 | 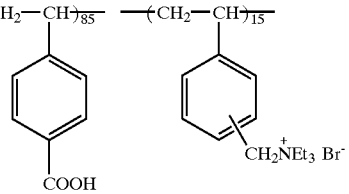 | 28,000 |
| No. 32 | 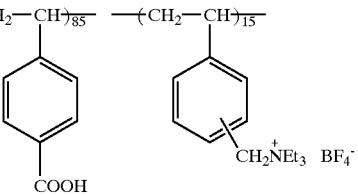 | 28,000 |
| No. 33 | 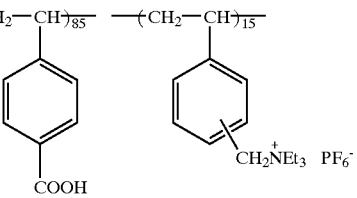 | 28,000 |
| No. 34 | 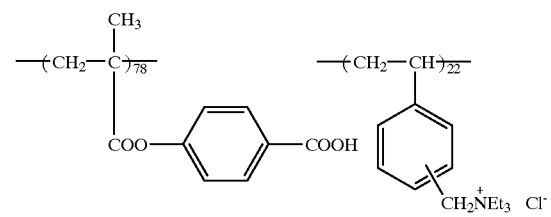 | 34,000 |
| No. 35 | 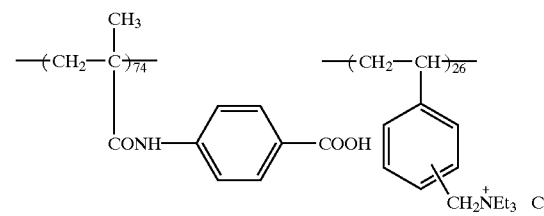 | 42,000 |

-continued

| No. 36 | $-(CH_2-C(CH_3))_{66}-(CH_2-C(CH_3))_{34}-$ with COO-C6H4-COOH and COOCH2CH2N+Me3 Cl− | 13,000 |
|---|---|---|
| No. 37 | $-(CH_2-CH)_{48}-(CH_2-C(CH_3))_{52}-$ with phenyl-CH2P(O)(OH)2 and COOCH2CH2N+Me3 Cl− | 15,000 |
| No. 38 | $-(CH_2-C(CH_3))_{64}-(CH_2-C(CH_3))_{36}-$ with COOCH2CH2OP(O)(OH)2 and CONHCH2CH2N+Me3 Cl− | 46,000 |
| No. 39 | $-(CH_2-C(CH_3))_{72}-(CH_2-C(CH_3))_{28}-$ with COO-C6H4-COOH and COOCH2CH2N+HMe2 Cl− | 34,000 |
| No. 40 | $-(CH_2-C(CH_3))_{63}-(CH_2-CH)_{37}-$ with COOH and phenyl-CH2N+Et3 Cl− | 63,000 |
| No. 41 | $-(CH_2-CH)_{72}-(CH_2-C(CH_3))_{28}-$ with phenyl-COOH and CONHCH2CH(OH)CH2N+Me3 Cl− | 25,000 |
| No. 42 | $-(CH_2-C(CH_3))_{82}-(CH_2-C(CH_3))_{18}-$ with CONH-C6H4-COOH and CONHCH2CH(OH)CH2N+Me3 Cl− | 25,000 |
| No. 43 | $-(CH_2-CH)_{73}-(CH_2-CH)_{27}-$ with phenyl-SO2NHCO-C6H4-CH3 and phenyl-CH2N+Me3 Cl− | 33,000 |

| No. | Structure | MW |
|---|---|---|
| No. 44 | (polymer structure with CH₃/CONHSO₂-C₆H₄-CH₃ and CH₂-pyridinium Cl) 66:34 | 41,000 |
| No. 45 | (polymer structure with SO₂NHSO₂-phenyl and CH₂-pyridinium Cl) 81:19 | 14,000 |
| No. 46 | (polymer structure with CONH-C(CH₃)₂-CH₂-SO₃H and CH₂NEt₃⁺ Cl⁻) 75:25 | 22,000 |
| No. 47 | (terpolymer with COOH, CH₂NEt₃⁺ Cl⁻, and COOCH₂CH₂OH) 65:24:11 | 23,000 |
| No. 48 | (terpolymer with COOH, CH₂NEt₃⁺ Cl⁻, and COOCH₃) 72:23:5 | 47,000 |

The above-described polymers can generally be prepared by radical chain polymerization (see "Textbook of Polymer Science" 3rd edition (1984) F. W. Billmeyer, A Wiley-Interscience Publication).

The molecular weight of each of the above-described polymers may be of a wide range, but when it is measured by using a light scattering method, the polymerization average molecular weight (Mw) is preferably in the range of 500 to 2,000,000, more preferably in the range of 1,000 to 600,000. Further, the number average molecular weight (Mn) calculated from an integral intensity of an end group and a side-chain functional group in NMR measurement is preferably in the range of 300 to 500,000, more preferably in the range of 500 to 100,000.

When the molecular weight of the aforementioned polymer is less than the lower limit value of the above-mentioned numerical range, the layer-to-layer adhesion strength of the support and the photosensitive layer becomes weak and the durability in printing may deteriorate. On the other hand, when the molecular weight exceeds the upper limit value of the numerical range, the layer-to-layer adhesion strength of the support and the photosensitive layer becomes extremely strong, and there is a possibility that residuum of the photosensitive layer in non-image portions cannot sufficiently be removed.

Further, the amount of an unreacted monomer contained in the above-described polymer may be of a wide numerical range, but it is preferably 20% by weight or less, more preferably 10% by weight or less.

A polymer whose molecular weight is in the above-described numerical range is obtained by using together a chain transfer agent and a polymerization initiator when it is copolymerized with a corresponding monomer, and by adjusting an amount of the monomer to be added thereto.

The above-mentioned chain transfer agent is a substance which transfers a reaction active site due to chain transfer reaction in polymerization reaction, and a rate of frequency of the transfer reaction is represented by a chain transfer constant Cs.

The chain transfer constant $Cs \times 10^4$ (60° C.) of the chain transfer agent is preferably 0.01 or greater, more preferably 0.1 or greater, and most preferably 1 or greater.

Concrete examples of the chain transfer agent are halogen compounds such as carbon tetrachloride and carbon tetrabromide, alcohols such as isopropyl alcohol or isobutyl alcohol, olefins such as 2-methyl-1-butene, 2,4-diphenyl-4-methyl-1-pentene, or the like, sulfur-containing compounds such as ethanethiol, butanethiol, dodecanethiol, mercaptoethanol, mercaptopropanol, mercapto methylpropionate, mercapto ethylpropionate, mercapto propionate, thioglycolate, ethyldisulfide, sec-butyldisulfide, 2-hydroxyethyldisulfide, thiosalicylate, thiophenol, thiocresol, benzyl mercaptan, and phenethyl mercaptan. Among them, ethanethiol, butanethiol, dodecanethiol, mercaptoethanol, mercaptopropanol, mercapto metyhlpropionate, mercapto ethylpropionate, mercapto propionate, thioglycolate, ethyldisulfide, sec-butyldisulfide, 2-hydroxyethyldisulfide, thiosalicylate, thiophenol, thiocresol, benzyl mercaptan, and phenethyl mercaptan are preferably used. Further, ethanethiol, butanethiol, dodecanethiol, mercaptoethanol, mercaptopropanol, mercapto methylpropionate, mercapto ethylpropionate, mercapto propionate, thioglycolate, ethyldisulfide, sec-butyldisulfide, and 2-hydroxyethyldisulfide are particularly preferably used.

As the above-described polymerization initiator, a peroxide, azo compound, and redox initiator, which are generally used frequently during radical polymerization, can be used as are. Among them, an azo compound is particularly preferable.

Next, examples of synthesis of each of the above-described polymers will be described.

Synthesis 1: Synthesis of Polymer No. 1

50.4 g of p-vinyl benzoate (manufactured by Hokko Chemical Industry Co., Ltd.), 15.2 g of triethyl (p-vinylbenzyl) ammonium chloride, 1.9 g of mercapto ethanol, and 153.1 g of methanol were placed in a 2-liter three-necked flask, and were heated and kept at 60° C. while being stirred under a nitrogen stream. To this solution was added 2.8 g of 2,2'-azobis(isobutyric acid)dimethyl followed by stirring for 30 minutes. Thereafter, a solution with a mixture of 201.5 g of p-vinyl benzoate, 60.9 g of triethyl (p-vinylbenzyl) ammonium chloride, 7.5 g of mercapto methanol, and 11.1 g of 2,2'-azobis (isobutyric acid) being dissolved in 612.3 g of methanol was added dropwise to the reaction mixture over a period of 2 hours. After completion of the addition, the reaction mixture was stirred at 65° C. for 10 hours under a nitrogen stream. After the reaction, the mixture was allowed to stand to be cooled down to the room temperature. The yield of the reaction mixture was 1,132 g and the density of solid matters thereof was 30.5 wt %.

The number average molecular weight (Mn) of the obtained polymer was 2,100 according to $^{13}$C-NMR spectrum.

Synthesis 2: Synthesis of Polymer No. 2

A polymer having a number average molecular weight (Mn) of 4,800 was obtained by conducting the procedure of Synthesis 1, except that triethyl(p-vinylbenzyl)ammonium chloride was replaced with an m/p (2/1) mixture of triethyl (vinylbenzyl)ammonium chloride and mercapto ethanol was replaced with mercapto ethyl propionate.

Synthesis 3: Synthesis of Polymer No. 25

146.9 g (0.99 mol) of p-vinyl benzoate (manufactured by Hokko Chemical Industry Co., Ltd.), 44.2 g (0.21 mol) of vinylbenzyltrimethyl ammonium chloride, and 446 g of 2-methoxyethanol were placed in a 1-liter three-necked flask, and were heated and kept at 75° C. while being stirred under a nitrogen stream. To this solution was added 2.76 g (12 mmol) of 2,2-azobis(isobutyric acid)dimethyl followed by stirring. After 2 hours, to the mixture was added 2.76 g (12 mmol) of 2,2-azobis(isobutyric acid)dimethyl. Further, after 2 hours, 2.76 g (12 mmol) of 2,2-azobis(isobutyric acid)dimethyl was added once again. Then, the mixture was stirred for two hours, and thereafter, it was allowed to stand to be cooled down to the room temperature. The reaction mixture was poured into 12 liters of ethyl acetate with stirring. A precipitated polymer was filtered and dried. The yield of the polymer was 189.5 g. The weight average molecular weight (Mw) of the obtained polymer was 32,000 according to molecular weight measurement using a light scattering method.

Further, in the present invention, in addition to the above polymer, a compound represented by the following general formula (6) can be added to the intermediate layer.

   General formula (6)

In the above general formula (6), $R_1$ represents an arylene group having 6 to 14 carbon atoms, and m and n each represent an integer of 1 to 3.

The compound represented by the general formula (6) will be described hereinafter.

The arylene group represented by $R_1$ preferably has 6 to 10 carbon atoms, and concretely, a phenylene group, a naphthyl group, an anthryl group, a phenathryl group, and the like are used.

The arylene group represented by $R_1$ may be substituted by an alkyl group having 1 to 10 carbon atoms, an alkenyl group having 2 to 10 carbon atoms, an alkynyl group having 2 to 10 carbon atoms, an aryl group having 6 to 10 carton atoms, a carboxylic acid ester group, an alkoxy group, a phenoxy group, a sulfonate group, a phosphonic acid ester group, a sulfonyl amide group, a nitro group, a nitrile group, an amino group, a hydroxy group, a halogen atom, an ethylene oxide group, a propylene oxide group, or triethyl ammonium chloride group.

Concrete examples of the compound represented by the above general formula (6) include 3-hydroxy benzoate, 4-hydroxy benzoate, salicylic acid, 1-hydroxy-2-naphthoic acid, 2-hydroxy-1-naphthoic acid, 2-hydroxy-3-naphthoic acid, 2,4-dihydroxy benzoate, 10-hydroxy-9-anthracene carbonic acid, and the like. These compounds may be used singly or may be used in combination of two or more.

The intermediate layer containing the above-mentioned polymer and the compound represented by the general formula (6) to be added thereto as occasion demands is formed on an aluminum support subjected to hydrophilizing treatment, which will be described later, by various coating methods.

The intermediate layer may be formed by any method described below. For example, the polymer and the compound represented by the general formula (6) to be added as occasion demands are dissolved in an organic solvent such as methanol, ethanol, or methyl ethyl ketone, or in a mixture thereof, or in a solvent containing the organic solvent and water mixed together, to prepare a solution, and thereafter, the solution is coated on an aluminum support to provide a layer which is then dried. Alternatively, the polymer and the compound represented by the general formula (6) to be added as occasion demands are dissolved in an organic solvent such as methanol, ethanol, or methyl ethyl ketone, or in a mixture thereof, or in a solvent containing the organic solvent and water mixed together, to prepare a solution, and thereafter, an aluminum support is immersed in the solution to provide a layer which is then rinsed with water and dried.

In the former method, a solution containing 0.005 to 10% by weight of the compound can be applied by various methods. Examples of the methods include bar coating, rotational coating, spray coating, curtain coating, and the like.

In the latter method, the concentration of the solution is in the range of 0.005 to 20% by weight, preferably in the range of 0.01 to 10% by weight, the immersion temperature is in the range of 0 to 70° C., preferably in the range of 5 to 60° C., and the immersion time is in the range of 0.1 seconds to 5 minutes, preferably in the range of 0.5 seconds to 2 minutes.

The pH of the solution to be coated is adjusted to a value of 0 to 12, preferably 0 to 6 by using a base such as ammonia, triethylamine, or potassium hydroxide, an inorganic acid such as hydrochloric acid, phosphoric acid, sulfuric acid, or nitric acid, various organic acids such as organic sulphonate, for example, nitrobenzene sulfonic acid or naphthalene sulfonic acid, organic phosphonate, for example, phenyl phosphonic acid, and organic carbonic acid, for example, benzoate, coumaric acid, or malic acid, organic chloride such as naphthalene sulfonyl chloride or benzene sulfonyl chloride, or the like. Further, a substance which absorbs ultraviolet light, visible light, or infrared light may be added to the above-mentioned solution so as to improve the reproducibility of the surface characteristics of the planographic printing original plate.

The proper coated amount after drying of the coating solution is in the range of 1 to 100 mg/m$^2$ in total, preferably in the range of 2 to 70 mg/m$^2$.

If the coated amount is less than 1 mg/m$^2$ or exceeds 100 mg/m$^2$, a desirable effect may not be obtained.

[Photosensitive Layer]

The positive-type photosensitive composition for an infrared laser, which is contained in the photosensitive layer, includes at least (A) alkali-soluble polymeric compounds, (B) compounds which have a function to deteriorate the solubility of the alkali-soluble polymeric compounds into alkaline water due to compatibility with the alkali-soluble polymeric compounds and of which various functions deteriorate by being heated; and (C) compounds which generate heat by absorbing light, and further includes other components as occasion demands.

(A) alkali-soluble polymeric compounds (hereinafter referred to as "component A")

The alkali-soluble polymeric compounds are not particularly limited so long as they are conventionally well known. Preferably, they each include, in a molecule thereof, a functional group selected from (1) a phenolic hydroxyl group, (2) a sulfonamide group, and (3) an active imido group. As the alkali-soluble polymeric compounds, the following compounds can be used. However, the present invention is not limited to the same.

(1) Examples of the polymeric compounds having a phenolic hydroxyl group include: novolak resins, such as a phenol/formaldehyde resin, an m-cresol/formaldehyde resin, a p-cresol/formaldehyde resin, an m-cresol/p-cresol mixed formaldehyde resin, and a phenol/cresol (which may be m-cresol, p-cresol, or a mixture of m-cresol and p-cresol) mixed formaldehyde resin; and a pyrogallol/acetone resin.

As the polymeric compounds having a phenolic hydroxyl group, polymeric compounds having a phenolic hydroxyl group in a side chain may also be preferably used. Examples of the polymeric compounds having a phenolic hydroxyl group in a side chain include polymeric compounds obtained by homopolymerization of a polymeric monomer comprising low molecular compounds each having at least one unsaturated bond which can be polymerized with a phenolic hydroxyl group or by copolymerization of the above polymeric monomer with a different polymeric monomer.

Examples of the polymeric monomers having a phenolic hydroxyl group include phenolic hydroxyl group-containing acrylamide, methacrylamide, acrylate, methacrylate, hydroxystyrene, and the like. Concrete examples of these monomers include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, 2-(4-hydroxyphenyl)ethyl methacrylate, and the like. These resins may be used singly or may be used in a combination of two or more. Further, any of these resins may be combined with a condensation polymerization product from a phenol substituted by an alkyl group having 3 to 8 carbon atoms and formaldehyde, such as a t-butylphenol/formaldehyde resin or an octylphenol/formaldehyde resin, as described in U.S. Pat. No. 4,123,279.

(2) A polymeric compound which has a sulfonamide group and is soluble in alkaline water is obtained by homopolymerization of a polymeric monomer having a sulfonamide group or by copolymerization of the monomer with a different polymeric monomer.

Examples of the polymeric monomers having a sulfonamide group, include a monomer comprised of a compound which has a low molecular weight and has in a molecule thereof at least one sulfonamide group (—NH—SO$_2$—) having at least one hydrogen atom linked to a nitrogen atom together with at least one unsaturated bond capable of polymerization. Among these polymeric monomers, a compound having a low molecular weight and having an acryloyl group, an allyl group, or a vinyloxy group, together with a substituted or mono-substituted aminosulfonyl group or a substituted sulfonylimino group is preferably used.

Examples of these compounds include the compounds represented by any of the following general formulae (I) to (V).

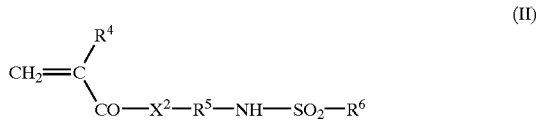

-continued

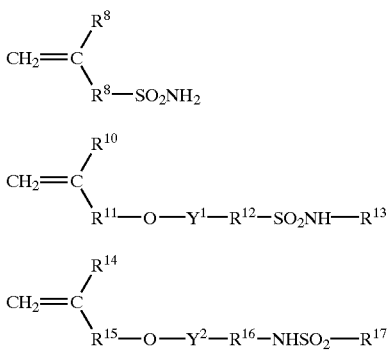

In the general formulae (I) to (V), $X^1$ and $X^2$ each represent —O— or —$NR^7$—. $R^1$ and $R^4$ each represent a hydrogen atom or —$CH_3$. $R^2$, $R^5$, $R^9$, $R^{12}$, and $R_{16}$ each represent an alkylene group, a cycloalkylene group, an arylene group, or an aralkylene group, each group having 1 to 12 carbon atoms and possibly having a substituent group. $R^3$, $R^7$, and $R^{13}$ each represent a hydrogen atom, or alternatively an alkyl group, a cycloalkyl group, an aryl group, or an aralkyl group, each group having 1 to 12 carbon atoms and possibly having a substituent group. $R^6$ and $R^{17}$ each represent an alkyl group, a cycloalkyl group, an aryl group, and an aralkyl group, each group having 1 to 12 carbon atoms and possibly having a substituent group. $R^8$, $R^{10}$, and $R^{14}$ each represent a hydrogen group or —$CH_3$. $R^{11}$ and $R^{15}$ each represent a single bond or alternatively an alkylene group, a cycloalkylene group, an arylene group, or an aralkylene group, each group having 1 to 12 carbon atoms and possibly having a substituent group. $Y^1$ and $Y^2$ each represent a single bond or —CO—.

Concrete examples of the compounds include m-aminosulfonylphenyl methacrylate, N-(p-aminosulfonylphenyl)methacrylamide, and N-(p-aminosulfonylphenyl)acrylamide.

(3) A polymeric compound which has an active imido group and is soluble in alkaline water preferably has in a molecule thereof an active imido group represented by the following formula. The polymeric compound is obtained by homopolymerization of a polymeric monomer comprised of a compound having a low molecular weight and having in a molecule thereof at least one active imido group represented by the formula given below, together with at least one unsaturated bond capable of polymerization or by copolymerization of the above monomer with a different polymeric monomer.

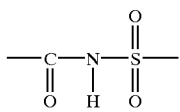

Preferred specific examples of the compounds include N-(p-toluenesulfonyl)methacrylamide and N-(p-toluenesulfonyl)acrylamide.

In the present invention, as the above-mentioned alkali-soluble polymeric compounds, a polymeric compound obtained by polymerization of two or more of the polymeric monomer having a phenolic hydroxyl group, the polymeric monomer having a sulfonamide group, and the polymeric monomer having an active imido group, or alternatively a polymeric compound obtained by copolymerization of the two or more of these polymeric monomers with a different polymeric monomer is preferably used.

When the polymeric monomer having a sulfonamide group and/or the polymeric monomer having an active imido group are copolymerized with the polymeric monomer having a phenolic hydroxyl group, the weight ratio of the monomers is preferably in the range of from 50:50 to 5:95, more preferably 40:60 to 10:90.

In the present invention, when the alkali-soluble polymeric compound is a copolymer which includes the polymeric monomer having a phenolic hydroxyl group, or the polymeric monomer having a sulfonamide group, or the polymeric monomer having an active imido group, and also includes a different polymeric monomer, the content of a monomer which imparts solubility in alkaline water is preferably in the range of 10 mol % or more, more preferably in the range of 20 mol % or more. If the content of the monomer which imparts solubility in alkaline water is less than 10 mol %, the solubility in alkaline water is apt to become insufficient and improvement in latitude in development may not be sufficiently achieved.

Examples of monomers which can be used as the monomer component to be copolymerized with the polymeric monomer having a phenolic hydroxyl group, the polymeric monomer having a sulfonamide group, or the polymeric monomer having an active imido group includes monomers of items (1) to (12) given below, but the present invention is not limited to the same.

(1) acrylates and methacrylates which have each an aliphatic hydroxyl group and are exemplified by 2-hydroxyethyl acrylate, 2-hydroxyethyl methacrylate, and the like (2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate (3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate (4) acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide (5) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether (6) vinyl esters such as vinyl acetate, vinyl chloroacetate, vinyl butyrate, and vinyl benzoate (7) styrenes such as α-methylstyrene, methylstyrene, and chloromethylstyrene (8) vinyl ketones such as methyl vinyl ketone, ethyl vinyl ketone, propyl vinyl ketone, and phenyl vinyl ketone (9) olefins such as ethylene, propylene, isobutylene, butadiene, and isoprene

(10) N-vinylpyrrolidone, N-vinylcarbazole, 4-vinylpyridine, acrylonitrile, and methacrylonitrile, and the like

(11) unsaturated imides such as maleimide, N-acryloylacrylamide, N-acetylmethacrylamide, N-propionylmethacrylamide, and N-(p-chlorobenzoyl)methacrylamide

(12) unsaturated carboxylic acids such as acrylic acid, methacrylic acid, maleic anhydride, and itaconic acid In the present invention, when the alkali-soluble polymeric compound is a homopolymer comprised of the polymeric monomer having a phenolic hydroxyl group, the polymeric monomer having a sulfonamide group, or the polymeric monomer having an active imido group, or alternatively a copolymer, the weight average molecular weight thereof is preferably 2,000 or more, more preferably 5,000 to 300,000. The number average molecular weight of the polymeric compound is preferably 500 or more, more preferably 800 to 250,000. The index of polydispersity (weight average molecular weight/number average molecular weight) of the polymeric compound is preferably in the range of 1.1 to 10.

Further, in the present invention, when the alkali-soluble polymeric compound is a resin such as a phenol/formaldehyde resin or a cresol/aldehyde resin, the weight average molecular weight of the resin is preferably in the range of 500 to 20,000, and the number average molecular weight of the resin is preferably in the range of 200 to 10,000.

The above-mentioned alkali-soluble polymeric compounds may be used singly or may be used in combination of two or more.

The amount of the alkali-soluble polymeric compound contained in the photosensitive layer is usually in the range of 30 to 99% by weight, preferably in the range of 40 to 95% by weight, and more preferably in the range of 50 to 90% by weight, based on the total weight of the solids of the photosensitive composition.

If the content amount of the alkali-soluble polymeric compound is less than 30% by weight, the durability of the photosensitive layer may become poor. If the content amount exceeds 99% by weight, sensitivity and durability may both inferior.

(B) compounds which have a function to deteriorate the solubility of the alkali-soluble polymeric compounds into alkaline water due to compatibility with the alkali-soluble polymeric compounds and of which various functions deteriorate by being heated (hereinafter referred to as "component B")

The component B has an excellent compatibility with the alkali-soluble polymeric compound (component A) by the action of a hydrogen-bonding functional group existing in a molecule thereof to thereby allow formation of a uniform coating liquid, and it is a compound which has a function of restraining the solubility of the alkali-soluble polymeric compound in alkaline water due to an interaction with the component A. Further, the above-mentioned function of the component B deteriorates (disappears) by being heated. When the component B itself is a compound which is decomposed by being heated, unless sufficient energy for decomposition is given depending on conditions such as laser output, irradiation time, and the like, the above-mentioned function is not sufficiently decreased and sensitivity may thereby deteriorate. Accordingly, the thermal decomposition temperature of the component B is preferably 150° C. or more.

Preferred specific examples of the component B include compounds which interact with the component A, such as a sulfone compound, ammonium salt, phosphonium salt, and an amide compound.

The component B must be suitably selected in consideration of the interaction with the component A. Concretely, when, for example, a novolak resin is used singly as the component A, a cyanine dye A, which will be exemplified later, is suitably used.

The compounding ratio of the component A to the component B is preferably in the range of 99/1 to 75/25.

If the amount of the component B is less than 99/1, the interaction with the component A is not sufficiently obtained and the solubility in alkaline water cannot be inhibited. Therefore, it is difficult to form a satisfactory image. If the amount of the component B is more than 75/25, the interaction becomes excessively great, and sensitivity remarkably deteriorates. Both cases are not preferable.

(C) compounds which generate heat by absorbing light (hereinafter referred to as "component C")

The compounds which generate heat by absorbing light are those having a light absorption region in an infrared region of, usually 700 nm or more, preferably 750 to 1,200 nm and revealing a light/heat conversion function by light of a wavelength in the above range. Concrete examples of the compounds include various pigments and dyes, which each generates heat by absorbing light of the above-mentioned wavelength range.

The above pigments include commercially available pigments and the pigments described in "Color Index (C.I.) Handbook", "The Handbook of the Latest Pigments" (Saishin Ganryo Binran), edited by the Japan Association of Pigment Technologies (Nihon Ganryo Gijutsu Kyokai) (1977), "Latest Pigment Application Technologies" (Saishin Ganryo Oyo Gijutsu), CMC, 1986, and "Printing Ink Technologies" (Insatsu Inki Gijutsu", CMC, 1984.

Examples of the kinds of the pigments include black pigments, yellow pigments, orange pigments, brown pigments, red pigments, purple pigments, blue pigments, green pigments, fluorescent pigments, metal powder pigments, and polymers containing chemically combined dyes. Specific examples of the pigments include insoluble azo pigments, azo lake pigments, condensed azo pigments, chelated azo pigments, phthalocyanine-based pigments, anthraquinone-based pigments, perylene-and perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, carbon black, and the like.

These pigments may be used without being surface-treated or may be used after being surface-treated. The above surface treatment is not particularly limited and examples thereof include a method in which a resin or a wax is coated on the surface of the pigment, a method in which a surfactant is adhered to the surface of the pigment, and a method in which a reactive substance (for example, a silane coupling agent, an epoxy compound, or polyisocyanate) is bound to the surface of the pigment. These surface treating methods are described in, for example, "Properties and Applications of Metal Soaps" (Saiwai Shobo Co., Ltd.), "Printing Ink Technologies" (Insatsu Inki Gijutsu), CMC, 1984, and "Latest Pigment Application Technologies" (Saishin Ganryo Oyo Gijutsu), CMC, 1986.

The diameter of the pigments is preferably in the range of 0.01 to 10 $\mu$m, more preferably in the range of 0.05 to 1 $\mu$m, and most preferably in the range of 0.1 to 1 $\mu$m.

If the diameter is less than 0.1 $\mu$m, dispersion stability of the pigments in a coating liquid used for preparing the photosensitive layer is insufficient, and if the diameter is greater than 10 $\mu$m, uniformity of the photosensitive layer is poor.

A known dispersion technology employed in the preparation of ink, toners, and the like can be used for the purpose of dispersing the pigments. A known dispersing machine can be used for dispersion of the pigments, and examples of the dispersing machine include an ultrasonic dispersing machine, a sand mill, an attritor, a pearl mill, a super mill, a ball mill, an impeller, a disperser, a KD mill, a colloid mill, a dynatron, a three-roller mill, a pressurized kneader, and the like. Details of these dispersion technologies are described in "Latest Pigment Application Technologies" (Saishin Ganryo Oyo Gijutsu), CMC, 1986.

The above dyes include commercially available dyes and dyes described in "Handbook of Dyes", edited by the Association of Organic Synthesis (Yuki Gosei Kagaku Kyokai) (1970). Specific examples of the dyes include azo dyes, azo dyes in the form of a metallic complex salt, pyrazolone azo dyes, anthraquinone dyes, phthalocyanine dyes, carbonium dyes, quinoneimine dyes, methine dyes, and cyanine dyes.

Among these pigments and dyes, the pigments and dyes, which absorb infrared or near-infrared rays, are particularly preferable for use in the present invention in the point of suitability for use in combination with a laser which emits infrared or near-infrared rays.

Carbon black may be suitably used as the pigment which absorbs infrared or near-infrared rays. Examples of the dyes which absorb infrared or near-infrared rays and are suitably used include cyanine dyes described in, for example, JP-A Nos. 58-125,246, 59-84,356, 59-202,829, and 60-78,787; methine dyes described in, for example, JP-A Nos. 58-173, 696, 58-181,690, and 58-194,595; naphthoquinone dyes described in, for example, JP-A Nos. 58-112,793, 58-224, 793, 59-48,187, 59-73,996, 60-52,940, and 60-63,744; squarylium dyes described in, for example, JP-A No.58-112, 792; cyanine dyes described in U.K. Patent No. 434,875; and dihydropyrimidinesquarylium dyes described in U.S. Pat. No. 5,380,635.

Other compounds which can be suitably used as the dyes include a near-infrared ray absorbing sensitizer described in U.S. Pat. No. 5,156,938. Also, particularly suitable compounds include: a substituted arylbenzo(thio)pyrylium salt described in U.S. Pat. No. 3,881,924; a trimethinethiopyrylium salt described in JP-A No. 57-142,645 (U.S. Pat. No. 4,327,169); pyrylium-based compounds described in JP-A Nos. 58-181,051, 58-220,143, 59-41,363, 59-84,248, 59-84, 249, 59-146,063, and 59-146,061; a cyanine dye described in JP-A No. 59-216,146; a pentamethinethiopyrylium salt described in U.S. Pat. No. 4,283,475; pyrylium compounds described in Japanese Patent Application Publication (JP-B) Nos. 5-13,514 and 5-19,702; Epolight III-178, Epolight III-130, Epolight III-125, Epolight IV-62A, and the like.

Further examples of particularly preferred dyes include the near-infrared ray absorbing dyes represented by the formulae (I) and (II) described in U.S. Pat. No. 4,756,993.

The amount of addition of the pigment or dyes is usually 0.01 to 50% by weight, preferably 0.1 to 10% by weight, based on the total weight of the solids in the photosensitive layer. The amount of the dyes is most preferably in the range of 0.5 to 10% by weight, and the amount of the pigment is most preferably in the range of 3.1 to 10% by weight.

If the amount of addition of the pigment or dyes is less than 0.01% by weight, sensitivity may become poor. If the amount of addition of the pigment or dyes is more than 50% by weight, uniformity of the photosensitive layer cannot be maintained and durability of the photosensitive layer may become poor.

These pigments or dyes may be added together with other components to the same layer, or alternatively may be added to a different layer. When the pigments or dyes are added to a different layer, they are preferably added to a layer adjacent to that contains the component B. Further, the above pigment or dyes are preferably added to the same layer which contains the component A, but may also be added to a different layer.

In the present invention, the above components B and C can be replaced with one compound having characteristics of both components (hereinafter referred to as "component B+C"), and the compound is, for example, represented by the following general formula (Z).

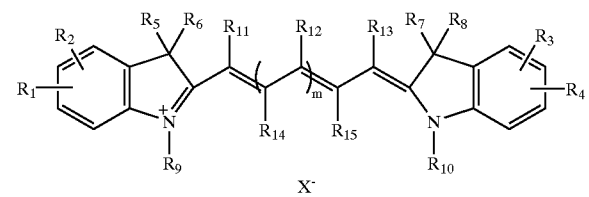

In the above general formula (Z), $R_1$ to $R_4$ each represent a hydrogen atom, or alternatively an alkyl group, an alkenyl group, an alkoxy group, a cycloalkyl group, or an aryl group, each group having 1 to 12 carbon atoms and possibly having a substituent group. $R_1$ and $R_2$, and $R_3$ and $R_4$ may each join together to form a cyclic structure. $R_1$ to $R_4$ are each selected independently from the group consisting of a hydrogen atom, a methyl group, an ethyl group, a phenyl group, a dodecyl group, a naphthyl group, a vinyl group, an allyl group, and a cyclohexyl group. Further, when these groups each have a substituent group, examples of the substituent group include a halogen atom, a carbonyl group, a nitro group, a nitrile group, a sulfonyl group, a carboxyl group, carboxylic acid ester, and sulfonic acid ester.

$R_5$ to $R_{10}$ each represent an alkyl group having 1 to 12 carbon atoms and possibly having a substituent group. $R_5$ to $R_{10}$ are each selected independently from the group consisting of a methyl group, an ethyl group, a phenyl group, a dodecyl group, a naphthyl group, a vinyl group, an allyl group, and a cyclohexyl group. Further, when these groups each have a substituent group, examples of the substituent group include a halogen atom, a carbonyl group, a nitro group, a nitrile group, a sulfonyl group, a carboxyl group, carboxylic acid ester, and sulfonic acid ester.

$R_{11}$ to $R_{13}$ each represent a hydrogen atom, a halogen atom, or an alkyl group having 1 to 8 carbon atoms and possibly having a substituent group. $R_{12}$ may be linked to $R_{11}$ or $R_{13}$ to form a cyclic structure, and when m>2, plural $R_{12}$ may also join together to form a cyclic structure. $R_{11}$ to $R_{13}$ are each selected independently from the group consisting of a chlorine atom, a cyclohexyl group, a cyclopentyl ring comprised of plural $R_{12}$ joining together, and a cyclohexyl ring. When these groups each have a substituent group, examples of the substituent group include a halogen atom, a carbonyl atom, a nitro group, a nitrile group, a sulfonyl group, a carboxyl group, a carboxylic acid ester, and a sulfonic acid ester. Further, m represents an integer of 1 to 8, preferably 1 to 3.

$R_{14}$ and $R_{15}$ each represent a hydrogen atom, a halogen atom, or an alkyl group having 1 to 8 carbon atoms and possibly having a substituent group. $R_{14}$ may be linked to $R_{15}$ to form a cyclic structure, and when m>2, plural $R_{14}$ may also join together to form a cyclic structure. $R_{14}$ and $R_{15}$ are each selected independently from the group consisting of a chlorine atom, a cyclohexyl group, a cyclopentyl ring comprised of plural $R_{14}$ joining together, and a cyclohexyl ring. When these groups each have a substituent group, examples of the substituent group include a halogen atom, a carbonyl atom, a nitro group, a nitrile group, a sulfonyl group, a carboxyl group, a carboxylic acid ester, and a sulfonic acid ester. Further, m represents an integer of 1 to 8, preferably 1 to 3.

In the above general formula (Z), $X^-$ represents an anion. Concrete examples of the anion include perchloric acid, boric acid tetrafluoride, phosphoric acid hexafluoride, tri-isopropylnaphthalene sulfonic acid, 5-nitro-o-toluene sulfonic acid, 5-sulfosalicylic acid, 2,5-dimethylbenzene sulfonic acid, 2,4,6-trimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and paratoluene sulfonic acid. Among them, phosphoric acid hexafluoride, or alkyl aromatic sulfonates such as triisopropylnaphthalene sulfonic acid or 2,5-dimethylbenzene sulfonic acid are particularly preferable.

The compound represented by the general formula (Z) is a compound generally referred to as a cyanine dye. Concretely, the compounds shown below are suitably used. The present invention is not limited to these examples.

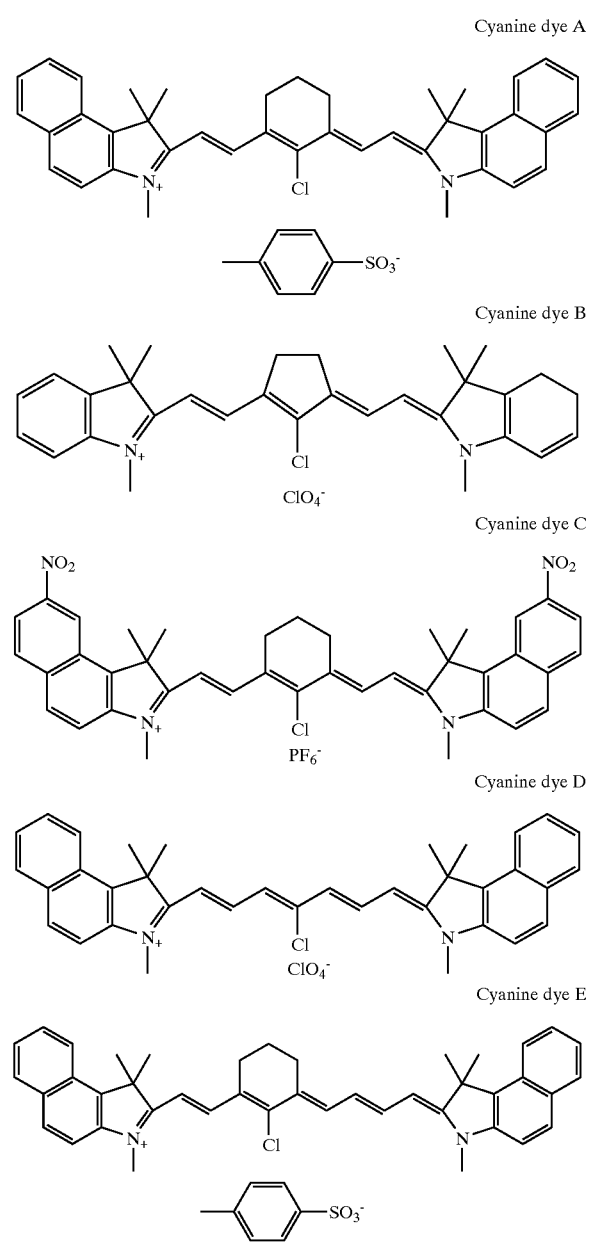

Cyanine dye A

Cyanine dye B

Cyanine dye C

Cyanine dye D

Cyanine dye E

The above component B+C has the property of generating heat by absorbing light (that is, the property of component C) and has a light absorbing region in an infrared region of 700 to 1,200 nm, and further, it is satisfactorily compatible with the alkali-soluble polymeric compound. The above component is a basic dye and has, in a molecule thereof, a group which interacts with the alkali-soluble polymeric compound, such as an ammonium group or an iminium group (that is, the property of component B). Accordingly, the component B+C interacts with the alkali-soluble polymeric compound so as to control the alkaline solubility, and can thereby be used suitably in the present invention.

In the present invention, when the component B+C is used in place of the component B and the component C, the addition ratio of component B+C to the component A is preferably in the range of 99/1 to 70/30 from the standpoint of sensitivity, and more preferably in the range of 99/1 to 75/25.

Other Components

Various additives may be incorporated into the positive-type photosensitive composition for an infrared laser as occasion demands. For example, cyclic acid anhydrides, phenols, organic acids, and a sulfonyl compound can be used in order to improve the sensitivity.

Examples of the cyclic acid anhydride include phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride, and pyromellitic anhydride, as described in U.S. Pat. No. 4,115,128.

Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane, and the like.

Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Concrete examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid, bishydroxyphenylsulfone, methylphenylsulfone, diphenyldisulfone, and the like.

The amount of the cyclic acid anhydride, phenol, or organic acid contained in the positive-type photosensitive composition for an infrared laser is preferably in the range of 0.05 to 20% by weight, more preferably in the range of 0.05 to 15% by weight, and most preferably in the range of 0.1 to 10% by weight, based on the total weight of the solids of the composition.

Further, in order to broaden the stability of processing with respect to conditions of development, the positive-type photosensitive composition for an infrared laser may contain a nonionic surfactant as described in JP-A Nos. 62-251,740 and 3-208,514, or an amphoteric surfactant as described in JP-A Nos. 59-121,044 and 4-13,149.

Specific examples of the nonionic surfactant include sorbitan tristearate, sorbitan monopalmitate, sorbitan trioleate, stearic acid monoglyceride, polyoxyethylene nonylphenyl ether, and the like.

Specific examples of the amphoteric surfactant include alkyldi(aminoethyl)glycine, hydrochloric acid salt of alkylpolyaminoethylglycine, 2-alkyl-N-carboxyethyl-N-hydroxyethylimidazolinium betaine, N-tetradecyl-N,N-betaine (for example, Amogen K (tradename) manufactured by Dai-ichi Kogyo Seiyaku Co., Ltd.), and the like.

The amount of the nonionic surfactant or the amphoteric surfactant contained in the positive-type photosensitive composition for an infrared laser is preferably in the range of 0.05 to 15% by weight, more preferably in the range of 0.01 to 5% by weight, based on the total weight of the solids of the composition.

Further, the positive-type photosensitive composition for an infrared laser may contain a dye or a pigment as a printing-out agent which makes it possible to produce a visible image immediately after exposure-induced heating, or as an image coloring agent.

As a typical example of the printing-out agent, a combination of a compound which releases an acid by exposure-induced heating (i.e., a photoacid releasing agent) and an organic dye which is capable of forming a salt may be listed.

Specific examples of the printing-out agent include a combination of o-naphthoquinonediazide-4-sulfonyl halogenide and an organic dye which forms a salt as described in JP-A Nos. 50-36,209 and 53-8,128, and a combination of a trihalomethyl compound and an organic dye which forms a salt as described in JP-A Nos. 53-36,223, 54-74,728, 60-3,626, 61-143,748, 61-151,644, and 63-58,440. Examples of the trihalomethyl compound include an oxazole-based compound and a triazine-based compound, both of which are effective in providing good storability over time and a clear printed-out image.

A dye other than the above-mentioned salt-forming organic dyes can also be used as the image coloring agent. Suitable dyes include oil-soluble dyes and basic dyes in addition to the salt-forming organic dyes.

Specific examples of these dyes include Oil Yellow No. 101, Oil Yellow No. 103, Oil Pink No. 312, Oil Green BG, Oil Blue BOS, Oil Blue No. 603, Oil Black BY, Oil Black BS, Oil Black T-505 (tradenames, which are all manufactured by Orient Chemical Industries, Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the like. The dyes described in JP-A No. 62-293,247 and 5-313,359 are particularly preferable. The amount of the dye contained in the positive-type photosensitive composition for an infrared laser is preferably in the range of 0.01 to 10% by weight, more preferably in the range of 0.1 to 3% by weight, based on the total weight of the solids of the composition.

Further, if necessary, a plasticizer may be added to the positive-type photosensitive composition for an infrared laser in order to impart flexibility to a coating layer.

Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer or a polymer of acrylic acid or methacrylic acid, and the like.

Further, if necessary, a compound which is decomposed by light, such as quinonediazides or diazo compounds, may be added to the positive-type photosensitive composition for an infrared laser.

The amount of the compound added to the positive-type photosensitive composition for an infrared laser is preferably in the range of 1 to 5% by weight based on the total weight of the solids of the composition.

Preparation of a Photosensitive Layer

The above-mentioned photosensitive layer can usually be prepared by applying, onto an appropriate support, a coating liquid in which the above-described components are dissolved in a solvent.

Examples of the solvent used in the present invention include ethylene dichloride, cyclohexanone, methyl ethyl ketone, methanol, ethanol, propanol, ethyleneglycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and the like. These solvents may be used singly or may be used in combination of two or more.

The concentration of the components (total solids including additives) in the solvent is preferably in the range of 1 to 50% by weight. The amount of coating (solids) after coating and drying on the support varies according to uses, but the desirable amount is generally in the range of 0.5 to 5.0 g/m$^2$ for a photosensitive printing plate.

A coating method is not particularly limited, and various methods can be used. Examples of the methods include bar coating, rotational coating, spray coating, curtain coating, dip coating, air-knife coating, blade coating, roll coating, and the like.

As the amount of coating decreases, apparent sensitivity increases, but the coat characteristics of the photosensitive layer become poor.

In order to improve the coat characteristics, a surfactant can be added to the photosensitive layer. An example of this surfactant is a fluorine-based surfactant as described in JP-A No. 62-170,950. In this case, the amount of the surfactant added is preferably in the range of 0.01 to 1% by weight, more preferably in the range of 0.05 to 0.5% by weight, based on the total weight of the solids of the photosensitive layer.

Support

The support which is used in the present invention is a dimensionally stable plate-like material. Specific examples of the substrate include paper, paper laminated with a plastic (for example, polyethylene, polypropylene, polystyrene, or the like), metal plates (such as aluminum, zinc, and copper), plastic films (such as diacetylcellulose, triacetylcellulose, cellulose propionate, cellulose butyrate, cellulose butyrate acetate, cellulose nitrate, polyethylene terephthalate, polyethylene, polystyrene, polypropylene, polycarbonate, and polyvinyl acetal), and paper or plastic films laminated or vapor-deposited with the above-described metals.

Among these materials, a polyester film or an aluminum plate are preferable. The aluminum plate is particularly preferable, because it has good dimensional stability and is relatively cheap.

Preferred examples of the aluminum plate include a pure aluminum plate and a plate of an aluminum alloy containing aluminum as a main component together with traces of other elements. A further example of the substrate is a plastic film which is laminated or vapor-deposited with aluminum. Examples of the other elements contained in the aluminum alloy include silicon, iron, manganese, copper, magnesium, chromium, zinc, bismuth, nickel, and titanium. The total amount of the other elements included in the aluminum alloy is 10% by weight or less.

Although the aluminum which is particularly preferably used in the present invention is pure aluminum, the aluminum to be used in the present invention may contain a small amount of other elements, because limitations in refining technologies make the production of perfectly pure aluminum difficult. Accordingly, the composition of the aluminum plate used in the present invention is not particularly limited, and an aluminum plate of a conventionally known material may be used appropriately in the present invention.

The thickness of the aluminum plate used in the present invention is approximately 0.1 to 0.6 mm, preferably 0.15 to 0.4 mm, and most preferably 0.2 to 0.3 mm.

Prior to surface-roughening the aluminum plate, if desired, a degreasing treatment is performed in order to remove rolling oil from the surface of the aluminum plate by means of, for example, a surfactant, an organic solvent, an aqueous alkaline solution, or the like.

Surface-roughening of the aluminum plate may be performed by various methods. Examples of the methods include a method in which the surface is mechanically roughened, a method in which the surface is roughened by being electrochemically dissolved, and a method in which the surface is chemically dissolved in a selective manner.

The mechanical method may be a conventionally known method such as ball abrasion, brushing, blasting, and buffing. An example of the electrochemical method is electrolysis of the aluminum plate in an electrolyte solution, such as a hydrochloric acid or a nitric acid, using an alternating current or a direct current. A combination of a mechanical method and an electrochemical method can also be used as described in JP-A No. 54-63,902.

If necessary, the surface-roughened aluminum plate is then subjected to an alkali-etching treatment and a neutralizing treatment, and thereafter, the aluminum plate is subjected to an anodizing treatment so as to increase water retention and wear resistance of the surface.

Various electrolytes which are each capable of producing a porous oxide layer can be used as an electrolyte used for the anodizing treatment, and generally, sulfuric acid, phosphoric acid, oxalic acid, chromic acid, or a mixture of these acids can be used as the electrolyte. The concentration of the electrolyte may be determined appropriately, depending on the type of the electrolyte.

Conditions for the anodizing treatment vary depending on the type of electrolyte employed and cannot be stipulated unqualifiedly. Conditions generally applied are as follows: the concentration of the electrolyte solution is 1 to 80% by weight; the temperature of the solution is 5 to 70° C.; the current density is 5 to 60 A/dm$^2$; the voltage is 1 to 100V; and the duration of the electrolysis is 10 seconds to 5 minutes.

The amount of a coat formed by the anodizing treatment is preferably 1.0 g/m$^2$ or more, more preferably in the range of 2.0 to 6.0 g/m$^2$.

If the amount of the coat formed by the anodizing treatment is less than 1.0 g/m$^2$, the surface does not have sufficient printing durability and the non-image portions are liable to form scratch marks, which collect printing ink during printing to cause so-called "scratch smudging".

Although a surface of the support, which is to be printed, is subjected to the anodizing treatment, generally, a coat of 0.01 to 3 g/m$^2$ is also formed, by the anodizing treatment, on a reverse side of the support due to backing of an electric force line.

The surface of the support can be made hydrophilic after the anodizing treatment, and the hydrophilizing treatment may be a conventionally known method.

Examples of the hydrophilizing surface treatment include a treatment of the surface with an aqueous solution of an alkali metal silicate (such as sodium silicate) as described in U.S. Pat. Nos. 2,714,066, 3,181,461, 3,280,734, and 3,902,734, in which the support is immersed or electrolytically treated in an aqueous solution of sodium silicate. Further examples are a treatment of the surface with a potassium fluorozirconate as described in JP-B No. 36-22,063 and a treatment of the surface with a polyvinylphosphonic acid as described in U.S. Pat. Nos. 3,276,868, 4,153,461, and 4,689,272.

Among these treatments, in the present invention, the hydrophilizing surface treatment with a silicate is particularly preferable.

The surface treatment with a silicate will be described hereinafter. The aluminum plate on which a coat is formed by the anodizing treatment is immersed in an aqueous solution having 0.1 to 30% by weight, preferably 0.5 to 10% by weight of alkali metal silicate and a pH of 10 to 13 at 25° C., for 0.5 to 120 seconds at approximately 15 to 80° C.

If the pH of the aqueous solution of alkali metal silicate is less than 10, the aqueous solution is gelatized, and if the pH is greater than 13.0, the coat formed by the anodizing treatment is dissolved.

Examples of the alkali metal silicate include sodium silicate, potassium silicate, and lithium silicate.

Examples of a hydroxide used to increase the pH of the aqueous solution of alkali metal silicate include sodium hydroxide, potassium hydroxide, and lithium hydroxide.

An alkaline earth metallic salt or a metallic salt in the IV B group of the periodic system may be mixed in the above-described solution.

Examples of the alkaline earth metallic salt include water soluble salts, for example, nitrate such as calcium nitrate, strontium nitrate, magnesium nitrate, or barium nitrate, sulfate, hydrochloride, phosphate, acetate, oxalate, and borate.

Examples of the metallic salt in the IV B group of the periodic system include titanium tetrachloride, titanium trichloride, potassium titanium fluoride, potassium titanium oxalate, titanium sulfate, titanium tetraiodide, zirconium oxide chloride, zirconium dioxide, zirconium oxychloride, and zirconium tetrachloride.

The alkali earth metallic salt and the metallic salt in the IV B group of the periodic system may be used singly or may be used in combination of two or more.

The amount of the metallic salt added to the above solution is preferably in the range of 0.01 to 10% by weight, more preferably in the range of 0.05 to 5.0% by weight.

The above-described surface treatment with a silicate allows further improvement in the hydrophilic property of the surface of the aluminum plate, and therefore, ink is not liable to attach the non-image portions during printing, which results in that a stainproof ability improves.

A back coat may be formed on the reverse side of the support, if necessary.

Preferred examples of the back coat are a coating layer obtained by an organic polymeric compound described in JP-A No. 5-45,885 and a coating layer comprising a metallic oxide and obtained by hydrolyzing an organic or inorganic metallic compound and polycondensing the resulting product as described in JP-A No. 6-35,174.

Among these coating layers, layers made from alkoxy compounds of silicon such as $Si(OCH_3)_4$, $Si(OC_2H_5)_4$, $Si(OC_3H_7)_4$, and $Si(OC_4H_9)_4$ are particularly preferable, because these compounds are cheap and the coating layers of metal oxides made from these compounds are excellent in durability in development.

In the planographic printing original plate of the present invention, if necessary, an overcoat layer can be formed on the support.

The planographic printing original plate of the present invention is exposed image-wise by means of a solid laser or a semiconductor laser, emitting infrared rays having wavelengths of 760 to 1,200 nm. In the present invention, immediately after the laser irradiation, development processing may be carried out, but it is desirable to carry out a thermal treatment between a laser irradiation process and a development process. In this case, the thermal treatment is preferably carried out at 80 to 150° C. and for 10 seconds to 5 minutes. This thermal treatment makes it possible to reduce the amount of laser energy, which is required for recording, during the laser irradiation. After the above-described thermal treatment as occasion demands, the planographic printing original plate of the present invention is subjected to development processing with an aqueous alkaline solution.

A conventionally known aqueous alkaline solution can be used as a developer and as a replenisher solution, used for development of the planographic printing original plate of the present invention. For example, the aqueous alkaline solution used as a developer and as a replenisher solution comprises an inorganic alkali salt such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, or lithium hydroxide. In addition, an organic alkali can also be used for preparation of the aqueous alkaline solution. Examples of the organic alkali include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkalis may be used singly or may be used in combination of two or more. Among the above-mentioned alkalis, a particularly preferred developer is an aqueous solution of a silicate, such as sodium silicate, potassium silicate, or the like. This is because adjustment of developing performance of the developer is possible by varying the ratio of silicon oxide $SiO_2$ to alkali metal oxide $M_2O$, each of which is an element of the silicate, and by varying the concentrations thereof in the solution. For example, alkali metal silicates described in JP-A No. 54-62,004 and JP-B No. 57-7,427 are effectively used in the present invention.

When an automatic processor is used, an aqueous solution (a replenisher solution) whose alkali strength is higher than that of the developer in a tank can be replenished for the developer in the tank. As a result, the alkali strength of the alkali development processing solution can be increased, and therefore, a large amount of planographic printing original plates can be processed without exchanging the developer in the tank for a long period of time. Concretely, the above-mentioned alkali may be merely added to the alkali developer so that the pH of the alkali developer is approximately 12.5 to 13.5, preferably 12.8 to 13.3.

Further, in the present invention, if necessary, the alkali developer may contain a surfactant or an organic solvent.

Examples of the surfactants include anionic surfactants, cationic surfactants, nonionic surfactants, and amphoteric surfactants, and among them, nonionic surfactants are particularly preferable. So long as the alkali developer contains the nonionic surfactants, the durability in solubility of image portions in the alkali developer is maintained. Accordingly, even when the printing plate is subjected to development processing with a developer for which the aqueous solution having a high alkali strength is replenished, stable development can be realized. This is caused by an interaction between the alkali-soluble polymeric compound and the nonionic surfactants.

Further, the above-described interaction strongly operates when the nonionic surfactants include an ethylene oxide chain or a propylene oxide chain. When it contains the ethylene oxide chain, the interaction operates particularly strongly. It is considered that this is caused by an alkali-soluble group, particularly, a phenolic hydroxyl group, and the ethylene oxide chain interacting strongly with each other.

The nonionic surfactants are not particularly limited, and any conventionally known ones can be used. For example, polyoxyethylenealkyl ethers, polyoxyethylenealkylphenyl ethers, polyoxyethylenepolystyrylphenyl ethers, polyoxyethylenepolyoxypropylenealkyl ethers, esters of glyceryl fatty acids, esters of sorbitan fatty acids, esters of pentaerythritol fatty acids, esters of propyleneglycol monofatty acids, esters of saccharose fatty acids, esters of polyoxyethylenesorbitan fatty acids, esters of polyoxyethylenesorbitol fatty acids, esters of polyethyleneglycol fatty acids, esters of polyglycerine fatty acids, polyoxyethylene castor oil, esters of polyoxyethyleneglycerine fatty acids, fatty acid diethanolamides, N,N-bis-2-hydroxyalkylamines, polyoxyethylenealkylamine, triethanolamine fatty acid ester, trialkylaminoxide, and the like can be used.

The amount of these nonionic surfactants added to the alkali developer is preferably in the range of 0.001 to 5% by weight, more preferably in the range of 0.01 to 3% by weight, and most preferably in the range of 0.1 to 3% by weight.

If the added amount is less than 0.001% by weight, the nonionic surfactants cannot operate effectively, and if the added amount is greater than 5% by weight, the interaction operates excessively strongly and development may become impossible.

The weight average molecular weight of the nonionic surfactants is preferably in the range of 300 to 50,000, particularly preferably in the range of 500 to 5,000. These nonionic surfactants may be used singly or may be used in combination of two or more.

In the present invention, for the purposes of acceleration of development, dispersion of sludge resulting from development, and enhancement of the affinity of the image portions of the planographic printing original plate for ink, if necessary, the above-described alkali developer may contain, as other components, a reducing agent such as hydroquinone, resorcinol, and a salt of an inorganic acid, for example, sodium or potassium sulfite and sodium or potassium hydrogensulfite; a development stabilizer; an organic carboxylic acid, a defoaming agent, surfactants other than the nonionic surfactants; an agent to convert hard water into soft water; and an organic solvent, and further may contain conventionally known antiseptic agent, coloring agent, thickener, and defoaming agent.

The printing plate which has been developed with the developer and the replenisher solution described above is subjected to a post-treatment such as a treatment with rinsing water, a treatment with a rinsing solution containing a surfactant or the like, or a treatment with a desensitizing solution containing gum arabic or a starch derivative. A combination of these treatments may be employed as the post-treatment when the planographic printing original plate of the present invention is used.

In recent years, in the plate production and printing industries, automatic processors have been widely used in the processing printing plates for the purpose of rationalization and standardization of plate production. The automatic processor is generally comprised of a developing section and a post-treatment section, each comprising a device for transferring a printing plate, tanks filled with processing solutions, and a spraying device. An exposed printing plate is conveyed horizontally, and simultaneously, it is developed by the processing solutions sprayed from nozzles after being pumped up from the tanks.

There is also known a method in which a printing plate is immersed in and transferred through a processing tank filled with a processing solution by means of immersed guide rolls or the like. In these kinds of automatic processing, processing can be performed by supplying replenisher solutions to each of the processing solutions in accordance with the processed amount, the operating time, or the like. Further, a so-called single-use treatment system, in which a printing plate is processed with a substantially unused processing solution, can also be employed in the present invention.

The planographic printing plate obtained by development of the planographic printing original plate of the present invention is coated with a desensitizing gum, if necessary, and can be used in a printing process. If it is desired to impart a higher level of printing durability to the printing plate, the printing plate is subjected to a burning treatment.

When the printing plate is subjected to the burning treatment, it is desirable that the printing plate be treated with a surface-adjusting solution, which is described in, for example, JP-B Nos. 61-2,518 and 55-28,062, and JP-A Nos. 62-31,859 and 61-159,655, prior to the burning treatment.

According to these treatment methods, the planographic printing plate is coated with a surface-adjusting solution by using a sponge or absorbent cotton soaked with the solution; the planographic printing plate is immersed in a vat filled with the surface-adjusting solution; or the planographic printing plate is coated with the surface-adjusting solution by using an automatic coater. Further, by homogenizing the coated amount using a squeegee or a squeegee roller after coating, a more preferable result is obtained.

The suitable coated amount of the surface-adjusting solution is generally in the range of 0.03 to 0.8 mg/m$^2$ (dry weight). The planographic printing plate having been coated with the surface-adjusting solution is dried, and thereafter, it is heated to a high temperature, if necessary, by a burning processor (for example, Burning Processor BP-1300, trade name, manufactured by Fuji Photo Film Co., Ltd.). The temperature and time vary depending on the kinds of components forming the image, but the printing plate is preferably heated at a temperature in the range of 180 to 300° C. for 1 to 20 minutes.

After the burning treatment, the planographic printing plate may be, if necessary, subjected to conventionally employed treatments such as water-rinsing and gum-coating. However, if the surface-adjusting solution contains a water-soluble polymeric compound or the like, so-called desensitizing treatments such as gum-coating may be omitted.

The planographic printing plate thus prepared is mounted on an offset printing machine or the like and is then used for printing a large number of sheets.

Next, examples of the present invention will be explained, but it should be noted that the present invention is not limited to these examples.

Synthesis of Alkali-soluble Polymeric Compound 31.0 g (0.36 mol) of methacrylic acid, 39.1 g (0.36 mol) of ethyl chloroformate, and 200 ml of acetonitrile were placed in a 500-ml three-neck flask fitted with a stirrer, a condenser tube, and a dropping funnel. The resulting reaction mixture was stirred while being cooled on an ice water bath. Then, 36.4 g (0.36 mol) of triethylamine was added dropwise from the dropping funnel to the reaction mixture over a period of about one hour. After completion of the addition, the ice water bath was removed and the reaction mixture was stirred at a room temperature for 30 minutes.

Then, 51.7 g (0.30 mol) of p-aminobenzenesulfonamide was added to the reaction mixture, and the reaction mixture was stirred at 70° C. on an oil bath for about one hour. After the reaction, the reaction mixture was poured into 1 liter of water while the water was stirred, and the resulting mixture was stirred for 30 minutes. The mixture was filtered to collect a precipitate, which was slurried in 500 ml of water. The slurry was filtered to obtain a solid, which was then dried. The white solid substance thus obtained was N-(p-aminosulfonylphenyl)methacrylamide (the yield was 46.9 g).

Next, 5.04 g (0.0210 mol) of N-(p-aminosulfonylphenyl)methacrylamide, 2.05 g (0.0180 mol) of ethyl methacrylate, 1.11 g (0.021 mol) of acrylonitrile, and 20 g of N,N-dimethylacetamide were placed in a 100-ml three-neck flask fitted with a stirrer, a condenser tube, and a dropping funnel. The resulting reaction mixture was stirred at 65° C. on a warm water bath. To the reaction mixture was added 0.15 g of V-65 (manufactured by Wako Pure Chemical Industries, Ltd.), and the reaction mixture was stirred while being kept at 65° C. for 2 hours under a nitrogen stream. Further, a mixture of 5.04 g of N-(p-aminosulfonylphenyl)methacrylamide, 2.05 g of ethyl methacrylate, 1.11 g of acrylonitrile, 20 g of N,N-dimethylacetamide, and 0.15 g of V-65 was added dropwise from the dropping funnel to the reaction mixture over a period of 2 hours. After completion of the addition, the reaction mixture was stirred at 65° C. for additional 2 hours. After the reaction, 40 g of methanol was added to the reaction mixture and the mixture was cooled, and then poured into 2 liters of water while the water was stirred, and the resulting mixture was stirred for 30 minutes. The mixture was filtered to collect a precipitate, which was then dried. In this way, 15 g of a white solid substance was obtained. The weight average molecular weight (using polystyrene as a standard) of the alkali-soluble polymeric compound was 53,000 according to gel permeation chromatography.

Preparation of Support (Aluminum Plate)

An aluminum plate (type of material: 1050) of which thickness is 0.3 mm was cleaned with trichloroethylene and degreased, and thereafter, the plate was roughened with a nylon brush and an aqueous suspension of 400 mesh pumice powder. After being rinsed well with water, the aluminum plate was etched by a process comprising the steps of immersing the aluminum plate in an aqueous solution of 25% sodium hydroxide at 45° C. for 9 seconds, rinsing the aluminum plate with water, immersing the aluminum plate in an aqueous solution of 20% nitric acid for 20 seconds, and rinsing the aluminum plate with water. In the process, the etched amount of the grained aluminum plate was about 3 g/m$^2$. Next, the aluminum plate was subjected to an anodizing process comprising immersing the aluminum plate in a 7% sulfuric acid solution as an electrolyte solution through which a direct current having a density of 15 A/dm$^2$ was passed. This process produced an anodized film of 3 g/m$^2$. Then, the surface-treated aluminum plate was rinsed with water and thereafter dried, and a substrate A was thus obtained. Then, the substrate A was processed with an aqueous solution containing 2% by weight of sodium silicate at 25° C. for 15 seconds and thereafter rinsed with water. In this way, a substrate B as the support (aluminum plate) was obtained.

Then, the substrate B was then coated with a solution having the following composition, and the coated layer was dried at 80° C. for 15 seconds, to thereby prepare an intermediate layer. After drying, the coated amount of the polymer was 15 mg/m².

TABLE 1

|  | Substrate | Intermediate-layer polymer | Photosensitive-layer coating liquid |
|---|---|---|---|
| Example 1 | B | Exemplified compound No. 1 | Coating liquid 1 |
| Example 2 | B | Exemplified compound No. 21 | Coating liquid 1 |
| Example 3 | B | Exemplified compound No. 1 | Coating liquid 2 |
| Example 4 | B | Exemplified compound No. 21 | Coating liquid 2 |
| Comparative example 1 | A | — | Coating liquid 1 |
| Comparative example 2 | A | — | Coating liquid 2 |
| Comparative example 3 | A | — | Coating liquid 1 |
| Comparative example 4 | A | P-1 | Coating liquid 1 |

| | |
|---|---|
| Polymer shown in Table 1 | 0.3 g |
| methanol | 100 g |
| water | 1 g |

A photosensitive-layer-forming coating liquid 1 having the following composition was coated on the above intermediate layer in a coated amount of 1.8 g/m², and a planographic printing original plate 1 was obtained (Examples 1 and 2).

In such a manner as described above, a photosensitive-layer-forming coating liquid 2 having the following composition was coated on the above intermediate layer in a coated amount of 1.8 g/m², and a planographic printing plate 2 was obtained (Examples 3 and 4).

[Photosensitive-layer-forming coating liquid 1]

| | |
|---|---|
| alkali-soluble polymeric compound (component A) | 0.7 g |
| cyanine dye B (component B + C) | 0.1 g |
| tetrahydrophthalic anhydride | 0.05 g |
| p-toluenesulfinic acid | 0.002 g |
| a dye prepared by using 1-naphthalenesulfonic acid as the counter ion of Victoria Pure Blue BOH | 0.02 g |
| a fluorine-based surfactant (Megafac F-177 manufactured by Dainippon Ink and Chemicals Inc.) | 0.05 g |
| γ-butyrolactone | 8 g |
| methyl ethyl ketone | 8 g |
| 1-methoxy-2-propanol | 4 g |

[Photosensitive-layer-forming coating liquid 2]

| | |
|---|---|
| m-cresol/p-cresol novolac resin (m to p ratio: 6:4; weight average molecular weight: 3.500; content of unreacted cresol: 0.5% by weight) | 1.0 g |
| cyanine dye B (component B + C) | 0.1 g |
| tetrahydrophthalic anhydride | 0.05 g |
| p-toluenesulfinic acid | 0.002 g |
| a compound prepared by using 6-hydroxy-β-naphthalenesulfonic acid as the counter ion of Ethyl Violet | 0.02 g |
| a fluorine-based surfactant (Megafac F-177 manufactured by Dainippon Ink and Chemicals Inc.) | 0.05 g |
| γ-butyrolactone | 8 g |
| methyl ethyl ketone | 8 g |
| 1-methoxy-2-propanol | 4 g |

The alkali developer used in the development process was prepared according to the following composition.

| | |
|---|---|
| D-sorbitol | 5.1 parts by weight |
| sodium hydroxide | 1.1 parts by weight |
| triethanolamine/ethyleneoxide addition product (30 mol) | 0.03 parts by weight |
| water | 93.8 parts by weight |

For the purpose of comparison, the substrate A was prepared with no intermediate layer formed thereon and was coated with the above-mentioned photosensitive-layer-forming coating liquid 1 in a coated amount of 1.8 g/m², and planographic printing original plates were obtained (Comparative examples 1 and 2).

For the purpose of further comparison, the substrate B was prepared with no intermediate layer formed thereon and was coated with the above-mentioned photosensitive-layer-forming coating liquid 1 in a coated amount of 1.8 g/m², and a planographic printing original plate was obtained (Comparative example 3).

Moreover, the substrate B was then coated with a solution having the following polymer P-1, which is described in JP-A No. 10-69,092, and the coat was dried at 80° C. for 15 seconds, to thereby prepare an intermediate layer. After drying, the coated amount was 1.5 mg/m². Thereafter, the obtained substrate was coated with the photosensitive-layer-forming coating liquid 1 in a coated amount of 1.8 g/m², and a planographic printing original plate was obtained (Comparative example 4).

| P-1 | | |
|---|---|---|
| | Structure | Molecular weight (Mw) |
| P-1 | −(CH$_2$−CH)$_{100}$− with phenyl ring bearing COOH | 42,000 |

The obtained planographic printing original plates were exposed with a semiconductor laser having a power of 500 mW, a wavelength of 830 nm, and a beam diameter of 17 μm (1/e²) at a main scan speed of 5 m/second. The exposed printing plates were developed by using an automatic processor (PS Processor 900VR manufactured by Fuji Photo Film Co., Ltd.) fed with the developer prepared as described above and a rinsing solution FR-3 (1:7) and then evaluated in such a manner as described below. The results thereof are shown in Table 2.

[Solubility of Non-image Portions]

A state of a film which remains in the exposed region was observed visually and was evaluated based on the following criterion.

○: no film remains
X: a remaining film partially exists in the exposed region

[Durability in Printing]

When the planographic printing original plate of the present invention was mounted on a printing machine Rislon manufactured by Komori Printing Machine K. K. and was used for printing sheets, the durability in printing was evaluated based on a number of sheets, which can be printed in a normal state. A planographic printing original plate which allows a larger number of sheets to be printed in a normal state was judged to have better durability in printing.

[Smudging in Storage]

The planographic printing original plate of the present invention was mounted on a printing machine (a Hidel SOR-M) and 2,000 sheets were printed using the printing plate, and thereafter, the printing plate was removed from the printing machine and stored for 60 minutes. After the storage, printing was restarted using the printing plate and a state in which ink in the non-image regions is removed was observed and was evaluated based on the following criterion.

TABLE 2

|  | Solubility of non-image portions | Durability in printing (number of sheets) | Smudging in storage |
|---|---|---|---|
| Example 1 | ○ | 80,000 | ○ |
| Example 2 | ○ | 70,000 | ○ |
| Example 3 | ○ | 80,000 | ○ |
| Example 4 | ○ | 70,000 | ○ |
| Comparative example 1 | x | 80,000 | x |
| Comparative example 2 | x | 70,000 | x |
| Comparative example 3 | ○ | 5,000 | Δ |
| Comparative example 4 | ○ | 40,000 | Δ |

○: after printing restarts, ink adhering to the non-image portions is immediately removed
Δ: some time is needed until ink is removed
x: considerable long time is needed until ink is removed As is apparent from Table 2, the planographic printing original plates of the present invention have a high solubility of non-image portions in an alkali developer and are free of smudging in storage, and further have excellent durability in printing. On the other hand, in the planographic printing original plates of comparative examples 1 and 2 with no intermediate layer formed thereon, although excellent durability in printing is obtained, the solubility of non-image portions is poor and smudging in storage is caused. In comparative example 3 in which a photosensitive layer is formed directly on a substrate coated with silicate, the durability in printing is poor. Further, in comparative example 4 in which an intermediate layer comprised of the polymer described in JP-A No. 10-69,092, although the durability in printing is slightly improved, a problem in which smudging in storage occurs arises.

As described above, the present invention can provide a planographic printing original plate which, with a conventional processor or printer being capable of being utilized as is, can be processed directly based on digital signals from a computer or the like and which has excellent durability in printing and causes no smudging.

What is claimed is:

1. A planographic printing original plate comprising:

an intermediate layer which contains a polymer including, as a monomer unit, at least a monomer having an acid group and a monomer having an onium group; and a photosensitive layer comprised of a positive-type photosensitive composition for an infrared laser which contains: (A) at least an alkali-soluble polymeric compound; (B) a compound which has a function to deteriorate the solubility of the alkali-soluble polymeric compound in an alkaline aqueous solution due to compatibility with the alkali-soluble polymeric compound, said function deteriorating by compound (B) being heated; and (C) a compound which generates heat by absorbing light, said intermediate layer and said photosensitive layer being formed sequentially on a support which has been subjected to a hydrophilizing treatment.

2. A planographic printing original plate according to claim 1, wherein the polymer contained in the intermediate layer is a polymeric compound.

3. A planographic printing original plate according to claim 1, wherein the polymer contained in the intermediate layer is soluble in alkaline water.

4. A planographic printing original plate according to claim 3, wherein a number average molecular weight (Mn) of the polymer contained in the intermediate layer is in the range of 300 to 5,000.

5. A planographic printing original plate according to claim 4, wherein the polymer contained in the intermediate layer is obtained by using together a polymerization initiator and a chain transfer agent during radical polymerization.

6. A planographic printing original plate according to claim 1, wherein the hydrophilizing treatment is surface treatment with a silicate.

7. A planographic printing original plate according to claim 1, wherein the alkali-soluble polymeric compound comprises a polymeric compound having in the molecule thereof a functional group selected from phenol hydroxyl group, sulfonamide group, and active imido group.

8. A planographic printing original plate according to claim 1, wherein the compound having the function to deteriorate the solubility of the alkali-soluble polymeric compound in the alkaline aqueous solution due to compatibility with the alkali-soluble polymeric compound, said function deteriorating by the compound being heated, comprises a compound selected from sulfone compounds, ammonium salts, phosphonium salts, and amide compounds.

* * * * *